(12) United States Patent
Mehrotra et al.

(10) Patent No.: US 7,846,783 B2
(45) Date of Patent: Dec. 7, 2010

(54) USE OF POLY RESISTOR IMPLANT TO DOPE POLY GATES

(75) Inventors: Manoj Mehrotra, Plano, TX (US); Puneet Kohli, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/265,358

(22) Filed: Nov. 5, 2008

(65) Prior Publication Data

US 2010/0112764 A1    May 6, 2010

Related U.S. Application Data

(60) Provisional application No. 61/025,210, filed on Jan. 31, 2008.

(51) Int. Cl.
*H01L 21/335* (2006.01)
(52) U.S. Cl. ............... 438/142; 438/138; 438/152; 438/207; 438/230; 438/238; 438/299; 438/382; 257/E21.637
(58) Field of Classification Search .......... 438/318
See application file for complete search history.

(56) References Cited

U.S. PATENT DOCUMENTS 5,506,158 A * 4/1996 Eklund .................. 438/202
6,001,677 A * 12/1999 Shimizu ................. 438/231

\* cited by examiner

*Primary Examiner*—N Drew Richards
*Assistant Examiner*—Kyoung Lee
(74) *Attorney, Agent, or Firm*—John J. Patti; Wade J. Brady III; Frderick J. Telecky, Jr

(57) ABSTRACT

A process of fabricating an IC is disclosed in which a polysilicon resistor and a gate region of an MOS transistor are implanted concurrently. The concurrent implantation may be used to reduce steps in the fabrication sequence of the IC. The concurrent implantation may also be used to provide another species of transistor in the IC with enhanced performance. Narrow PMOS transistor gates may be implanted concurrently with p-type polysilicon resistors to increase on-state drive current. PMOS transistor gates over thick gate dielectrics may be implanted concurrently with p-type polysilicon resistors to reduce gate depletion. NMOS transistor gates may be implanted concurrently with n-type polysilicon resistors to reduce gate depletion, and may be implanted concurrently with p-type polysilicon resistors to provide high threshold NMOS transistors in the IC.

12 Claims, 18 Drawing Sheets

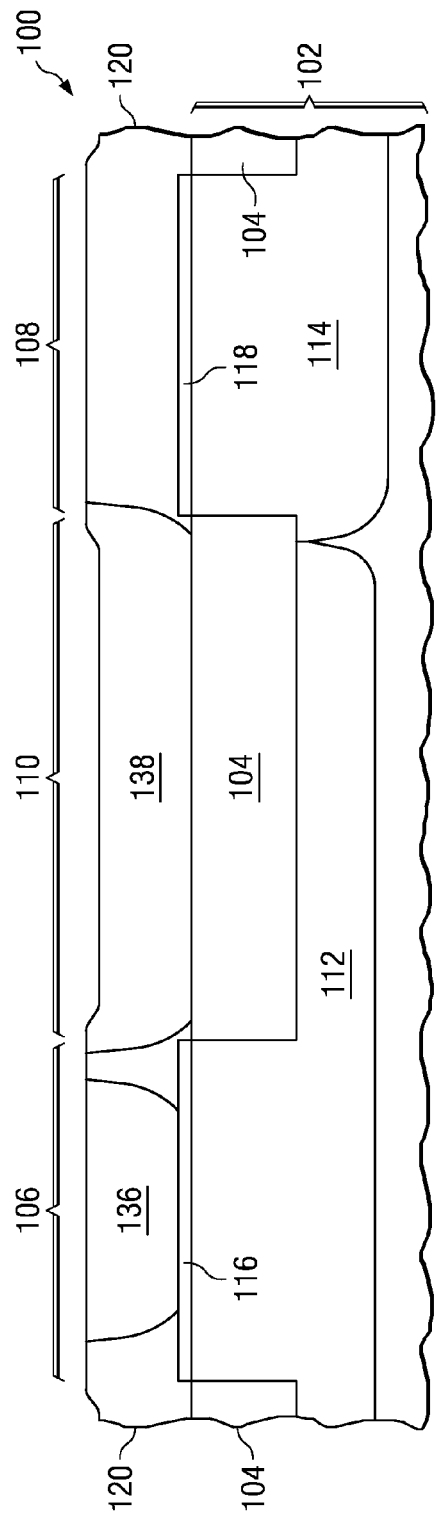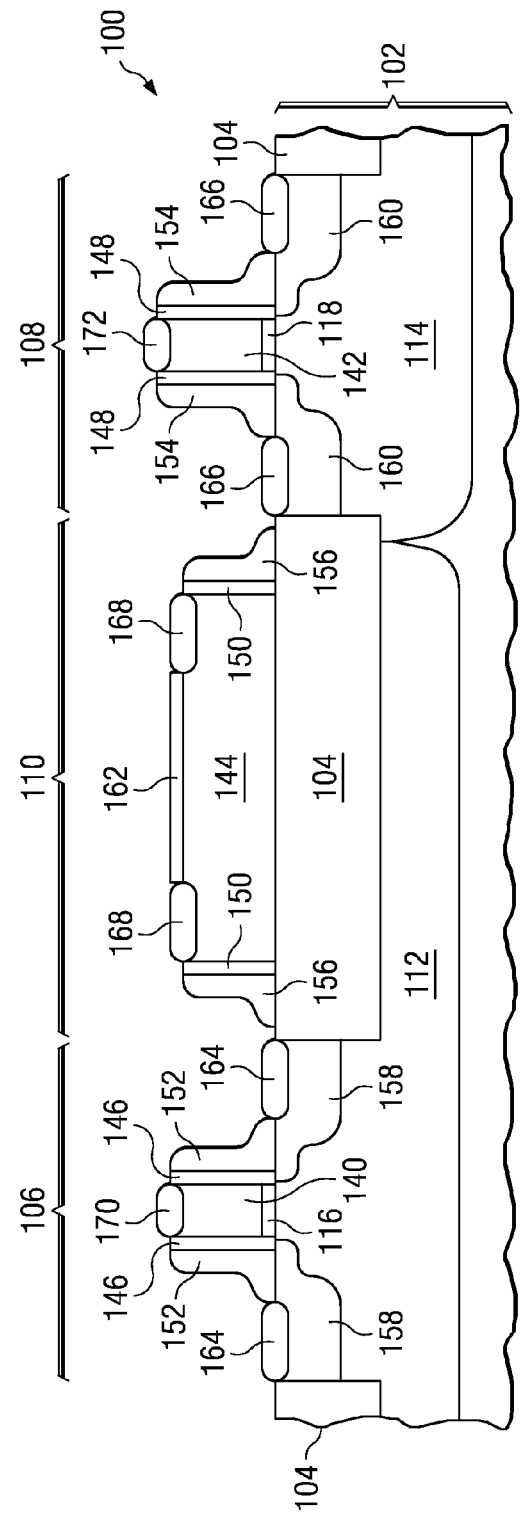

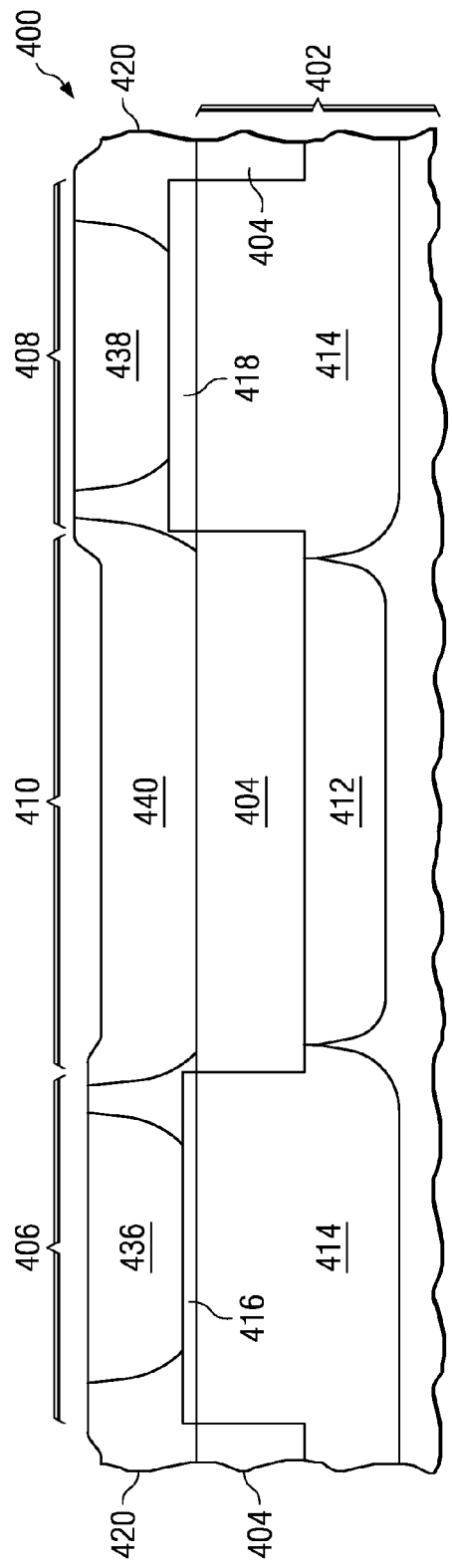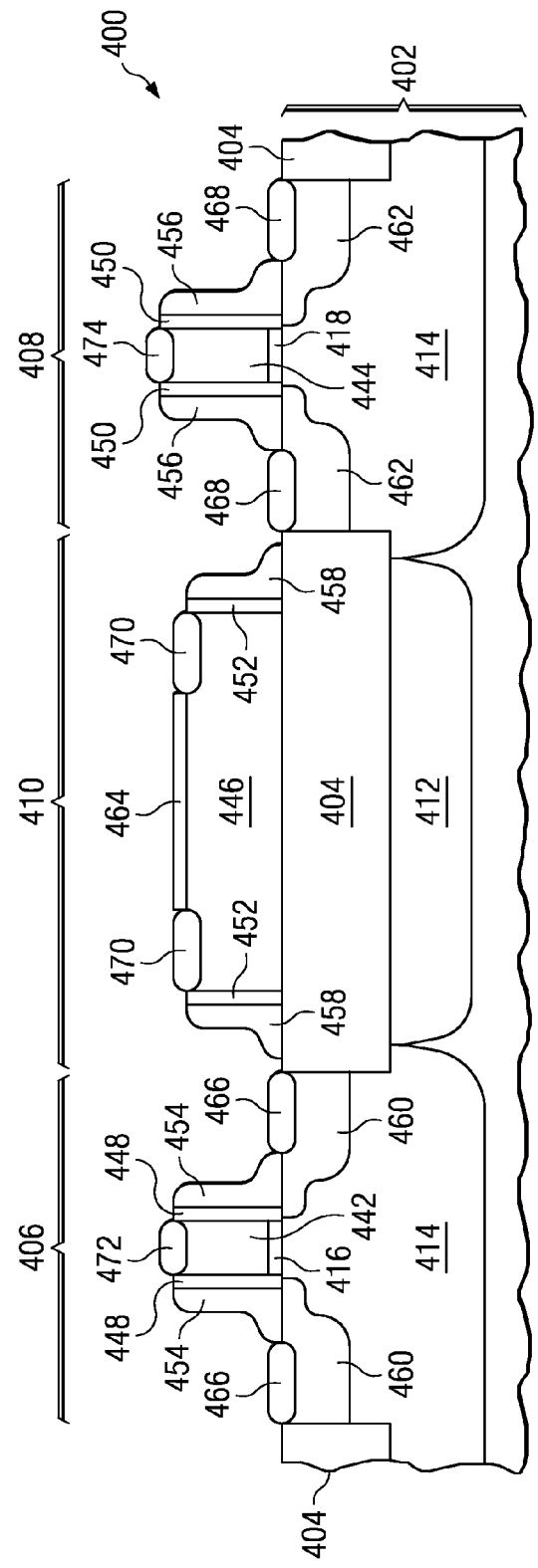

USE OF POLY RESISTOR IMPLANT TO DOPE POLY GATES

FIELD OF THE INVENTION

This invention relates to the field of integrated circuits. More particularly, this invention relates to integrated circuits with polysilicon resistors and MOS transistors.

BACKGROUND OF THE INVENTION

Transistor dimensions in integrated circuits (ICs) are shrinking with each new fabrication technology node, as articulated by Moore's Law. Reduced channel lengths of metal oxide semiconductor (MOS) transistors require shallower ion implants and tighter control of diffusion of implanted dopants in source and drain regions, resulting in less dopant densities in MOS gates near gate oxides, which is manifested as increased polysilicon depletion and reduced on-state drive currents.

SUMMARY OF THE INVENTION

A preferred embodiment of the present invention provides a method of fabricating an integrated circuit (IC) which includes a resistor of polycrystalline silicon (polysilicon) and a metal oxide semiconductor (MOS) transistor, in which an ion implantation process used to place dopant atoms into the polysilicon resistor is also used concurrently to place dopant atoms into a gate of the MOS transistor.

In accordance with a preferred embodiment of the present invention, a gate of an n-channel MOS (NMOS) transistor is implanted with n-type dopants, and an n-type polysilicon resistor and the NMOS gate are implanted with n-type dopants concurrently, to increase a concentration of n-type dopants in the NMOS gate. This embodiment may also be applied to a p-type polysilicon resistor and a gate of a p-channel MOS (PMOS) transistor.

In accordance with a preferred embodiment of the present invention, a gate of a PMOS transistor which receives a blanket n-type implant also receives a p-type implant concurrently with a p-type polysilicon resistor, to convert the PMOS gate to p-type.

In accordance with a preferred embodiment of the present invention, an undoped gate of a PMOS transistor is implanted with p-type dopants concurrently with a p-type polysilicon resistor, to establish a desired concentration of p-type gate dopants for the PMOS transistor. This embodiment may also be applied to an n-type polysilicon resistor and a gate of an NMOS transistor.

In accordance with a preferred embodiment of the present invention, a method is provided that applies to ICs with a low voltage PMOS transistor and a high voltage PMOS transistor. The low voltage PMOS gate receives a p-type implant to establish a desired concentration of p-type gate dopants for the low voltage PMOS transistor. The high voltage PMOS gate is not implanted concurrently with the low voltage PMOS gate, but is implanted with p-type dopants concurrently with a p-type polysilicon resistor to establish a desired concentration of p-type gate dopants for the high voltage PMOS transistor.

In accordance with a preferred embodiment of the present invention, a method is provided that applies to ICs with a narrow PMOS transistor and a wide PMOS transistor. Both narrow and wide transistors are implanted concurrently with p-type dopants to establish a desired concentration of p-type gate dopants for the wide PMOS transistor. The gate of the narrow PMOS transistor, that is, a PMOS transistor with a channel width less than twice its channel length, is further implanted with p-type dopants concurrently with a p-type polysilicon resistor to increase the concentration of p-type gate dopants in the narrow PMOS gate, which reduces polysilicon depletion in the narrow PMOS transistor.

In accordance with a preferred embodiment of the present invention, a gate of an NMOS transistor is implanted with n-type dopants, and a p-type polysilicon resistor and the NMOS gate are implanted with p-type dopants concurrently, to counterdope the n-type dopants in the NMOS gate. This embodiment may also be applied to an n-type polysilicon resistor and a gate of a PMOS transistor.

DESCRIPTION OF THE VIEWS OF THE DRAWING

FIG. 1A through FIG. 1D are cross-sections of an IC which include an NMOS transistor, an n-type polysilicon resistor, and a PMOS transistor formed in accordance with a preferred embodiment of the present invention;

FIG. 4A through FIG. 4D are cross-sections of an IC which include a low voltage PMOS transistor, a p-type polysilicon resistor, and a high voltage PMOS transistor formed in accordance with a preferred embodiment of the present invention;

DETAILED DESCRIPTION

The present invention is described with reference to the attached figures. The figures are not drawn to scale and they are provided merely to illustrate the invention.

For purposes of this disclosure, the term "conductivity polarity" of a dopant refers to the polarity of carrier, n-type or p-type, generated by the dopant in a semiconductor. For example, phosphorus and arsenic both generate n-type carriers in silicon, so both are considered be of the same conductivity polarity.

In accordance with a preferred embodiment of the present invention, a method of fabricating an integrated circuit (IC) is provided, where the IC includes a resistor of polycrystalline silicon, commonly known as polysilicon, and a metal oxide semiconductor (MOS) transistor, in which an ion implantation process used to place dopant atoms into the polysilicon resistor is also used to place dopant atoms into a gate of the MOS transistor.

An advantage is that desired concentrations of dopants may be established in gates of MOS transistors which receive dopant atoms during an implant of a polysilicon resistor. Another advantage is that a subset of transistors may receive dopant atoms during an implant of a polysilicon resistor, enabling formation of transistors whose gates have different work functions in a same IC, enabling optimization of some analog circuits. A further advantage is it may be implemented without adding cost or complexity to a fabrication process sequence of an IC containing the MOS transistors.

Figure 1A:
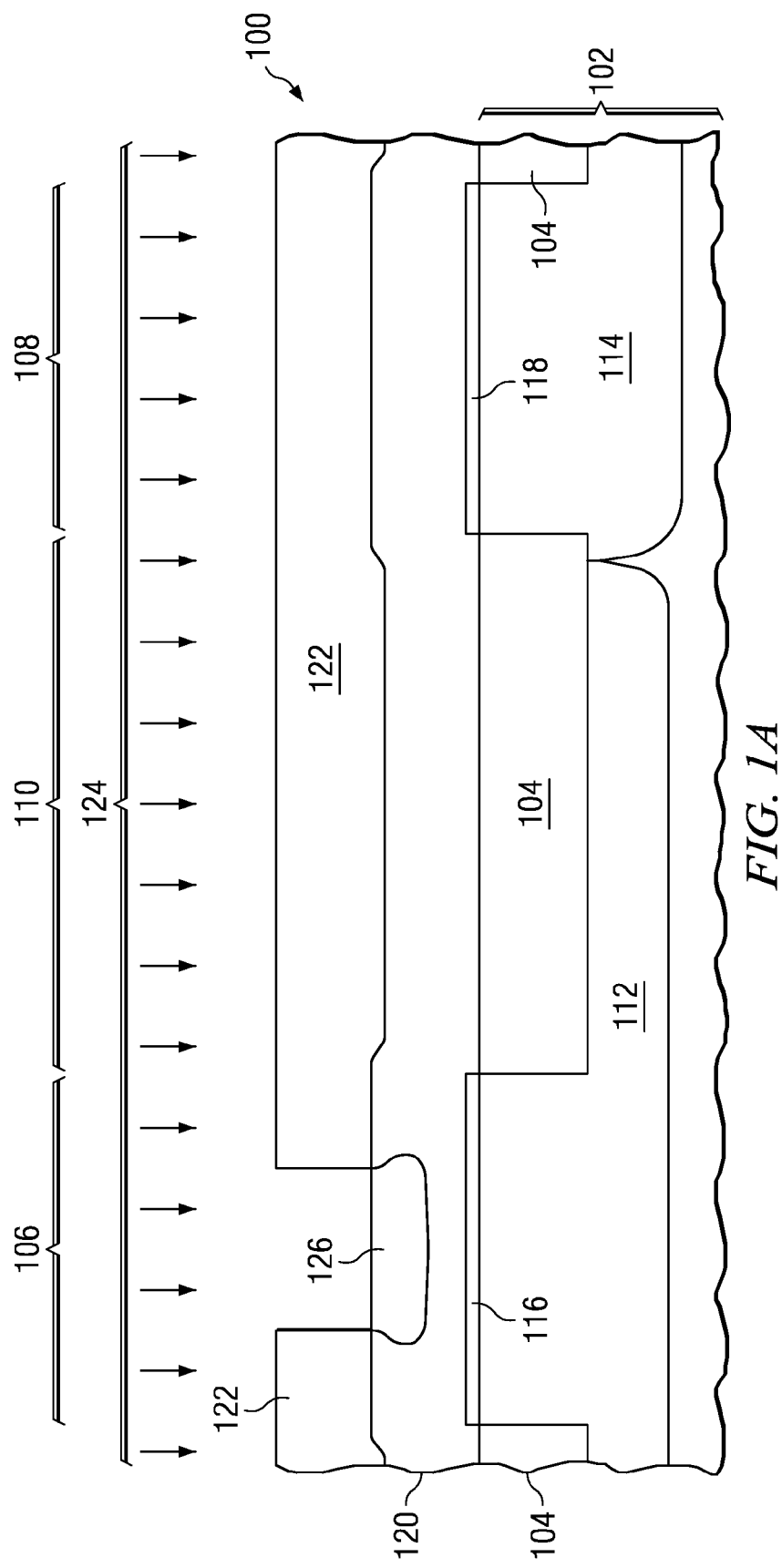

FIG. 1A through FIG. 1D are cross-sections of an IC which include an NMOS transistor, an n-type polysilicon resistor and a PMOS transistor formed according to a first embodiment of the instant invention. Referring to FIG. 1A, the IC 100 is fabricated on a substrate 102, typically single crystal silicon, and commonly p-type with an electrical resistivity of 1 to 100 ohm-cm, but possibly another type of substrate appropriate for fabrication of the IC 100, such as a silicon-on-insulator (SOI) wafer, or a hybrid orientation technology (HOT) wafer which contains regions of different crystal orientations. Elements of field oxide 104 are formed at a top surface of the substrate 102, typically of silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP). Openings in the elements of field oxide 104 define an NMOS area 106 for the NMOS transistor and a PMOS area 108 for the PMOS transistor. A contiguous region of field oxide defines a resistor area 110 for the n-type polysilicon resistor. A p-type well 112, commonly called a p-well, is formed in the substrate 102, typically by ion implanting a p-well set of p-type dopants, including boron and possibly gallium and/or indium, at doses from $1 \cdot 10^{11}$ to $1 \cdot 10^{14}$ atoms/cm$^2$, into the NMOS area 106 and the resistor area 110. A p-well photoresist pattern, not shown in FIG. 1A for clarity, is commonly used to block the p-well set of dopants from areas outside the p-well. The p-well 112 extends from a top surface of the substrate 102 to a depth typically 50 to 500 nanometers below a bottom surface of the field oxide elements 104. The ion implantation process to form the p-well 112 may include additional steps to implant additional p-type dopants at shallower depths for purposes of improving NMOS transistor performance, such as threshold adjustment, leakage current reduction and suppression of parasitic bipolar operation. An n-type well 114, commonly called an n-well, is formed in the substrate 102, typically by ion implanting an n-well set of n-type dopants, including phosphorus and arsenic, and possibly antimony, at doses from $1 \cdot 10^{11}$ to $1 \cdot 10^{14}$ atoms/cm$^2$, into the PMOS area 108. An n-well photoresist pattern, not shown in FIG. 1A for clarity, is commonly used to block the n-well set of n-type dopants from areas outside the n-well. The n-well 114 extends from the top surface of the substrate 102 to a depth typically 50 to 500 nanometers below the bottom surface of the field oxide elements 104. The ion implantation process to form the n-well 114 may include additional steps to implant additional n-type dopants at shallower depths for purposes of improving PMOS transistor performance, such as threshold adjustment, leakage current reduction and suppression of parasitic bipolar operation. A sheet resistivity of the n-well 114 is commonly between 100 and 1000 ohms/square. In an alternate embodiment, the n-well 114, rather than the p-well 112, may extend under the resistor area 110.

Still referring to FIG. 1A, an NMOS gate dielectric layer 116, typically silicon dioxide, nitrogen doped silicon dioxide, silicon oxy-nitride, hafnium oxide, layers of silicon dioxide and silicon nitride, or other insulating material, commonly between 1 and 4 nanometers thick, is formed on a top surface of the p-well 112. Similarly, a PMOS gate dielectric layer 118, also typically silicon dioxide, nitrogen doped silicon dioxide, silicon oxy-nitride, hafnium oxide, layers of silicon dioxide and silicon nitride, or other insulating material, commonly between 1 and 4 nanometers thick, is formed on a top surface of the n-well 114, and typically concurrently with the NMOS gate dielectric layer 116. A layer of polysilicon 120, commonly between 50 and 250 nanometers thick, is deposited on an existing top surface of the IC 100. An NMOS gate implant photoresist pattern 122 is formed on a top surface of the polysilicon layer 120 which exposes the polysilicon layer 120 in an NMOS gate area of the NMOS area 106. An NMOS gate set of n-type dopants 124, typically phosphorus and arsenic, and possibly antimony, is ion implanted into the NMOS gate area at a total dose between $1 \cdot 10^{14}$ cm$^{-2}$ and $1 \cdot 10^{16}$ cm$^{-2}$ to form a first NMOS gate implanted region 126 in the polysilicon layer 120. The NMOS gate implant photoresist pattern 122 is removed, commonly by exposing the IC 100 to an oxygen containing plasma, followed by a wet cleanup to remove any organic residue from the top surface of the polysilicon layer 120.

Figure 1B:
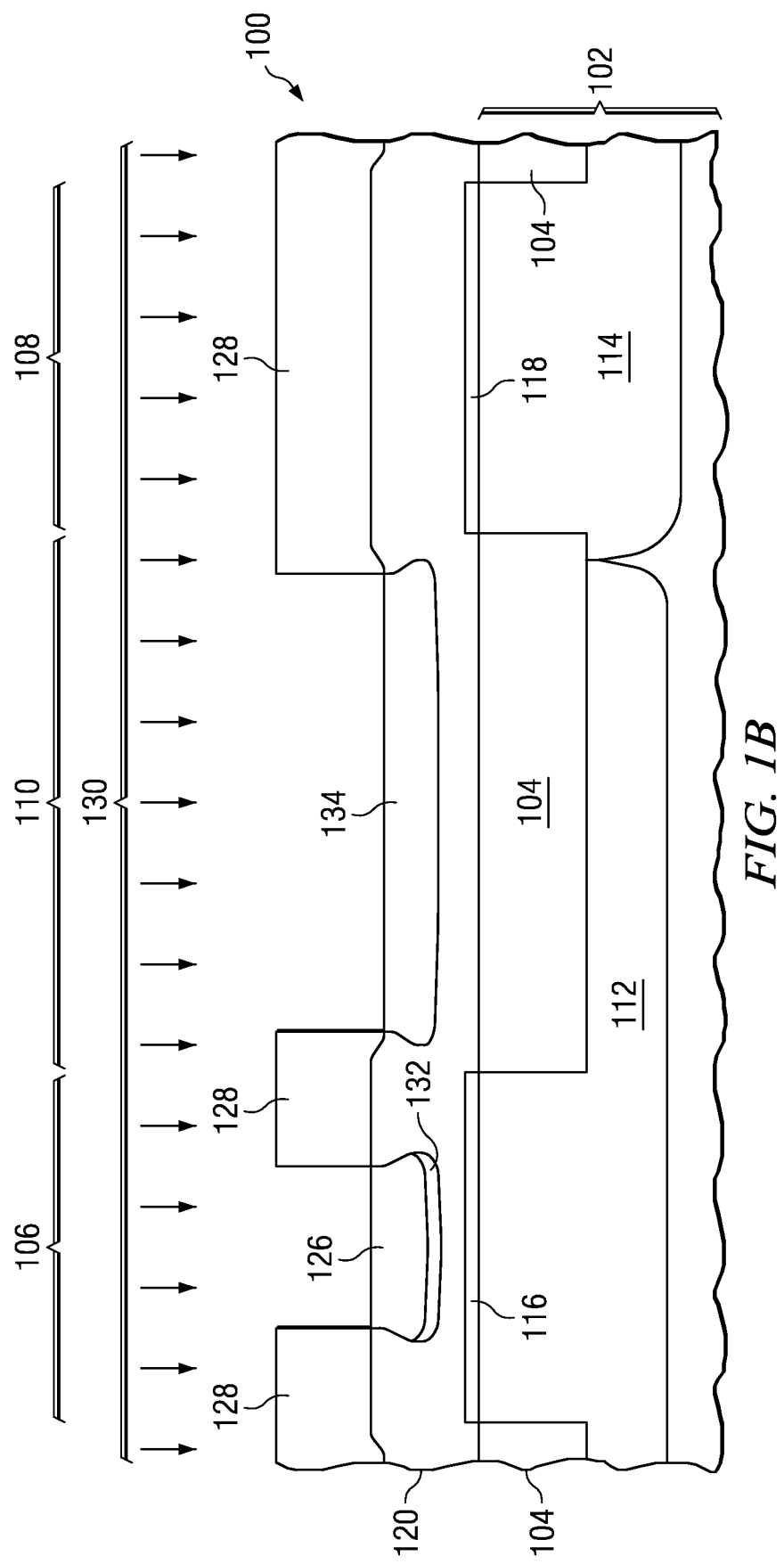

Referring to FIG. 1B, a polysilicon resistor implant photoresist pattern 128 is formed on a top surface of the polysilicon layer 120 which exposes the polysilicon layer 120 in the NMOS gate area and the resistor area 110. A polysilicon resistor set of n-type dopants 130, typically phosphorus and arsenic, and possibly antimony, is ion implanted into the NMOS gate area and the resistor area 110 at a total dose between $1 \cdot 10^{14}$ cm$^{-2}$ and $1 \cdot 10^{16}$ cm$^{-2}$ to form a second NMOS gate implanted region 132 and a polysilicon resistor implanted region 134 in the polysilicon layer 120, in the NMOS area 106 and the resistor area 110, respectively. The second NMOS gate implanted region 132 overlaps the first NMOS gate implanted region 126. The polysilicon resistor implant photoresist pattern 128 is removed by a similar process used to remove the NMOS gate implant photoresist pattern.

Referring to FIG. 1C, the IC 100 is annealed to diffuse the NMOS gate set of n-type dopants and the polysilicon resistor set of n-type dopants throughout the thickness of the polysilicon layer 120 and activate a portion of the dopants, to form an NMOS gate diffused region 136 and a resistor diffused region 138. Those familiar with integrated circuit fabrication will recognize that the NMOS gate set of n-type dopants and the polysilicon resistor set of n-type dopants may be implanted in any order and still obtain the structure described in reference to FIG. 1C.

Referring to FIG. 1D, fabrication of the IC 100 continues with formation of an NMOS gate 140, a PMOS gate 142 and a polysilicon resistor body 144, typically by forming a polysilicon etch photoresist pattern on a top surface of the polysilicon layer using known photolithographic methods to expose areas of unwanted polysilicon, and removing unwanted polysilicon using known etching methods. NMOS offset spacers 146 are formed on lateral surfaces of the NMOS gate 140, typically by growing a layer of thermal oxide on the lateral surfaces of the NMOS gate 140 followed by conformal deposition of one or more layers of silicon nitride and/or silicon dioxide, and removing the deposited silicon nitride and/or silicon dioxide from horizontal surfaces of the substrate 102 adjacent to the NMOS gate 140 by anisotropic etching methods, leaving between 1 and 20 nanometers of the deposited layers of silicon nitride and/or silicon dioxide on the lateral surfaces of the NMOS gate 140. PMOS offset spacers 148 are formed on lateral surfaces of the PMOS gate 142, and polysilicon resistor offset spacers 150 are formed on lateral surfaces of the polysilicon resistor body 144, by a similar process sequence. It is common for some steps in the formation of the NMOS offset spacers 146, PMOS offset spacers 148 and polysilicon resistor offset spacers 150 to be performed concurrently. NMOS sidewall spacers 152 are formed on lateral surfaces of the NMOS offset spacers 146, typically by depositing of one or more conformal layers of silicon nitride and/or silicon dioxide on an existing surface of the IC 100, followed by removing deposited silicon nitride and/or silicon dioxide from horizontal surfaces of the substrate 102 adjacent to the NMOS gate 140 by anisotropic etching methods, leaving between 10 and 60 nanometers of the deposited layers of silicon nitride and/or silicon dioxide on the lateral surfaces of the NMOS offset spacers 146. PMOS sidewall spacers 154 are formed on lateral surfaces of the PMOS offset spacers 148, and polysilicon resistor sidewall spacers 156 are formed on lateral surfaces of the polysilicon resistor offset spacers 150, by a similar process sequence. It is common for some steps in the formation of the NMOS sidewall spacers 152, PMOS sidewall spacers 154 and polysilicon resistor sidewall spacers 156 to be performed concurrently.

Continuing to refer to FIG. 1D, NMOS source and drain NSD regions 158 are formed in a top region of the p-well 112 adjacent to the NMOS sidewall spacers 152, typically by ion implanting an NSD set of n-type dopants, including phosphorus and arsenic, and possibly antimony, at a total dose between $3 \cdot 10^{14}$ and $1 \cdot 10^{16}$ atoms/cm² into NSD implanted regions in the p-well 112 adjacent to the NMOS sidewall spacers 152. It is common for the NMOS gate 140 to be implanted with the NSD dopants during formation of the NSD regions 158. An NSD photoresist pattern, not shown in FIG. 1D for clarity, is commonly used to block the NSD set of n-type dopants from areas outside the NSD implanted regions. An NSD anneal operation activates a portion of the n-type dopants in the NSD implanted regions to form NSD regions 134. The NSD regions 158 typically extend from the top surface of the p-well 112 to a depth between 100 and 500 nanometers, and typically extend laterally under the NMOS sidewall spacers 152.

Still referring to FIG. 1D, p-type source drain PSD regions 160 are formed in a top region of the n-well 114 adjacent to the PMOS gate sidewall spacers 154, typically by ion implanting a PSD set of p-type dopants, including boron, sometimes partly in the form $BF_2$, and possibly indium and/or gallium, at a total dose between $5 \cdot 10^{14}$ and $1 \cdot 10^{16}$ atoms/cm² into PSD implanted regions in the n-well 114 adjacent to the PMOS sidewall spacers 154. It is common for the PMOS gate 142 to be implanted with the PSD dopants during formation of the PSD regions 160. A PSD photoresist pattern, not shown in FIG. 1 for clarity, is commonly used to block the PSD set of p-type dopants from areas outside the PSD implanted regions. A PSD anneal operation, often performed concurrently with the NSD anneal operation, activates a portion of the p-type dopants in the PSD implanted regions to form PSD regions 160. The PSD regions 160 typically extend from the top surface of the n-well 114 to a depth between 100 and 500 nanometers, and typically extend laterally under the PMOS sidewall spacers 154.

Continuing to refer to FIG. 1D, a polysilicon resistor silicide block layer 162 is formed by deposition of silicide block material, typically one or more layers of silicon nitride, or one or more layers of silicon dioxide or a stack of silicon nitride and silicon dioxide layers, on the polysilicon resistor body 144, formation of a silicide block photoresist pattern, not shown in FIG. 1D for clarity, on a top surface of the silicide block material using known photolithographic methods, followed by removal of unwanted silicide block material by known etching methods. It is common to perform the deposition and etching processes for forming the NMOS sidewall spacers 152, the PMOS sidewall spacers 154, the polysilicon resistor sidewall spacers 156 and the polysilicon resistor silicide block layer 162 concurrently.

Continuing to refer to FIG. 1D, fabrication of the IC 100 continues with formation of NMOS metal silicide layers 164 on top surfaces of the NSD regions 158, PMOS metal silicide layers 166 on top surfaces of the PSD regions 160, resistor contact metal silicide layers 168 on each end of the polysilicon resistor body 144, an optional NMOS gate metal silicide layer 170 on a top surface of the NMOS gate 142 and an optional PMOS gate metal silicide layer 172 on a top surface of the PMOS gate 144. Metal silicide is typically formed by deposition of a refractory metal such as nickel, cobalt or titanium on a top surface of a region of exposed silicon, deposition of an optional cap layer on a top surface of the refractory metal, reaction of the silicon and refractory metal in a thermal process, and selective removal of the optional cap layer and unreacted refractory metal, commonly by exposing the IC 100 to wet etchants including a mixture of an acid and hydrogen peroxide, followed by an optional anneal process. The details of the metal silicide formation process, such as thickness of the deposited layers, and temperature and time of the thermal processes, vary considerably depending on the refractory metal used in the process. Metal silicide is not formed in regions where a silicide block layer, such as the polysilicon resistor silicide block layer 162, is formed on exposed silicon.

During operation of the NMOS transistor, on-state drive current is desirably increased by the presence of the polysilicon resistor set of n-type dopants from the polysilicon resistor ion implantation process, which reduce a depletion region in the NMOS gate 140 adjacent to the NMOS gate dielectric layer 116.

Alternatively, a PMOS gate area may receive additional p-type dopants during an ion implantation process to form a p-type resistor body in a p-type polysilicon resistor, producing a desirable increase in on-state drive current of a PMOS transistor by reducing a depletion region in a PMOS gate of the PMOS transistor adjacent to a PMOS gate dielectric layer in the PMOS transistor.

Moreover, a first NMOS transistor in an IC may receive additional n-type dopants during an ion implantation process to form an n-type resistor body in an n-type polysilicon resistor, and a second NMOS transistor of substantially equal size and shape as the first NMOS transistor may not receive additional n-type dopants during the ion implantation process to form the n-type resistor body, thus advantageously providing an NMOS transistor with a different threshold voltage than the first NMOS transistor, without adding fabrication cost or complexity.

In yet another alternative, a first PMOS transistor in an IC may receive additional p-type dopants during an ion implantation process to form an p-type resistor body in an p-type polysilicon resistor, and a second PMOS transistor of substantially equal size and shape as the first PMOS transistor may not receive additional p-type dopants during the ion implantation process to form the p-type resistor body, thus advantageously providing a PMOS transistor with a different threshold voltage than the first PMOS transistor, without adding fabrication cost or complexity.

Figure 2A:
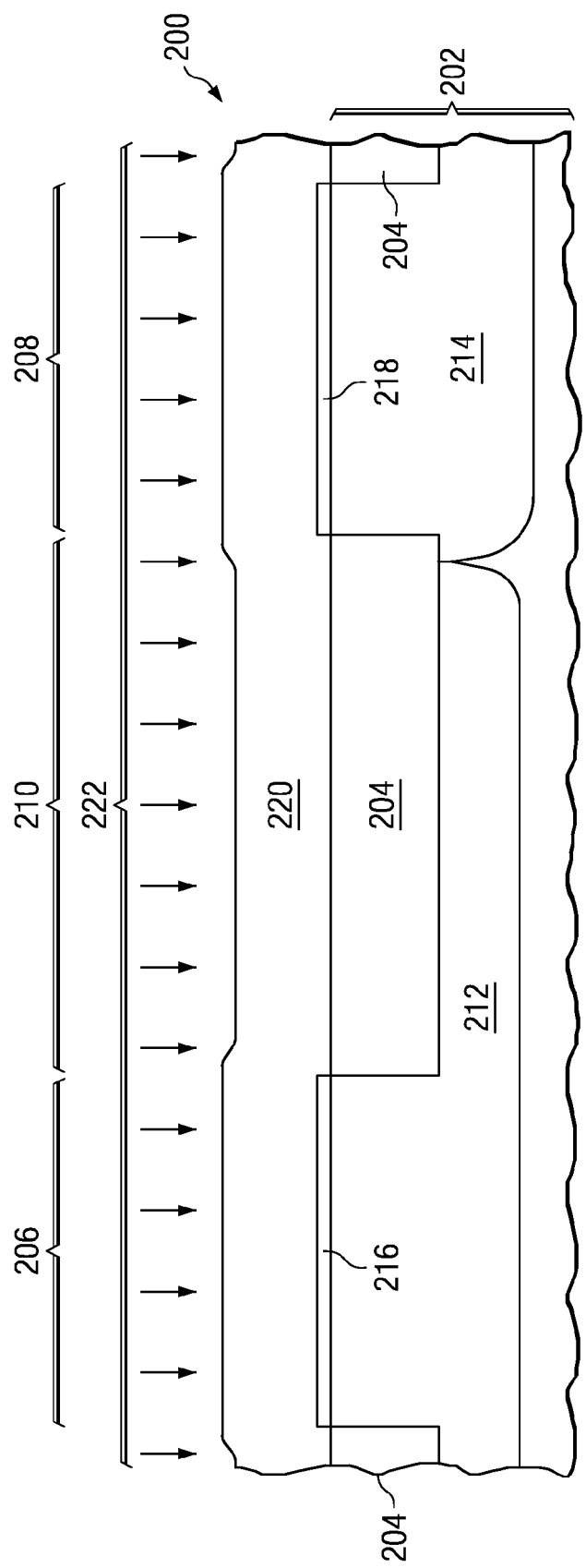
FIG. 2A through FIG. 2D are cross-sections of an IC which include an NMOS transistor, a p-type polysilicon resistor, and a PMOS transistor formed in accordance with a preferred embodiment of the present invention.

FIG. 2A through FIG. 2D are cross-sections of an IC which include an NMOS transistor, a p-type polysilicon resistor and a PMOS transistor formed according to a preferred embodiment of the present invention. Referring to FIG. 2A, the IC 200 is fabricated on a substrate 202 as described in reference to FIG. 1A. Elements of field oxide 204 are formed at a top surface of the substrate 202 as described in reference to FIG. 1A. Openings in the elements of field oxide 204 define an NMOS area 206 for the NMOS transistor and a PMOS area 208 for the PMOS transistor. A contiguous region of field oxide defines a resistor area 210 for the p-type polysilicon resistor. A p-well 212 is formed in the substrate 202 in the NMOS area 206 and the resistor area 210, as described in reference to FIG. 1A. An n-well 214 is formed in the substrate 202 in the PMOS area 208, as described in reference to FIG. 1A. Alternatively, the n-well 214, rather than the p-well 212, may extend under the resistor area 210. An NMOS gate dielectric layer 216 and a PMOS gate dielectric layer 218 are formed on a top surface of the p-well 212 and on a top surface of the n-well 214, respectively, as described in reference to FIG. 1A. A layer of polysilicon 220, commonly between 50 and 250 nanometers thick, is deposited on an existing top surface of the IC 200. A blanket gate set of n-type dopants 222, typically phosphorus and arsenic, and possibly antimony, is ion implanted into the polysilicon layer 220 at a total dose between $1 \cdot 10^{14}$ cm$^{-2}$ and $1 \cdot 10^{16}$ cm$^{-2}$ to form a blanket gate implanted region in the polysilicon layer 220.

Figure 2B:
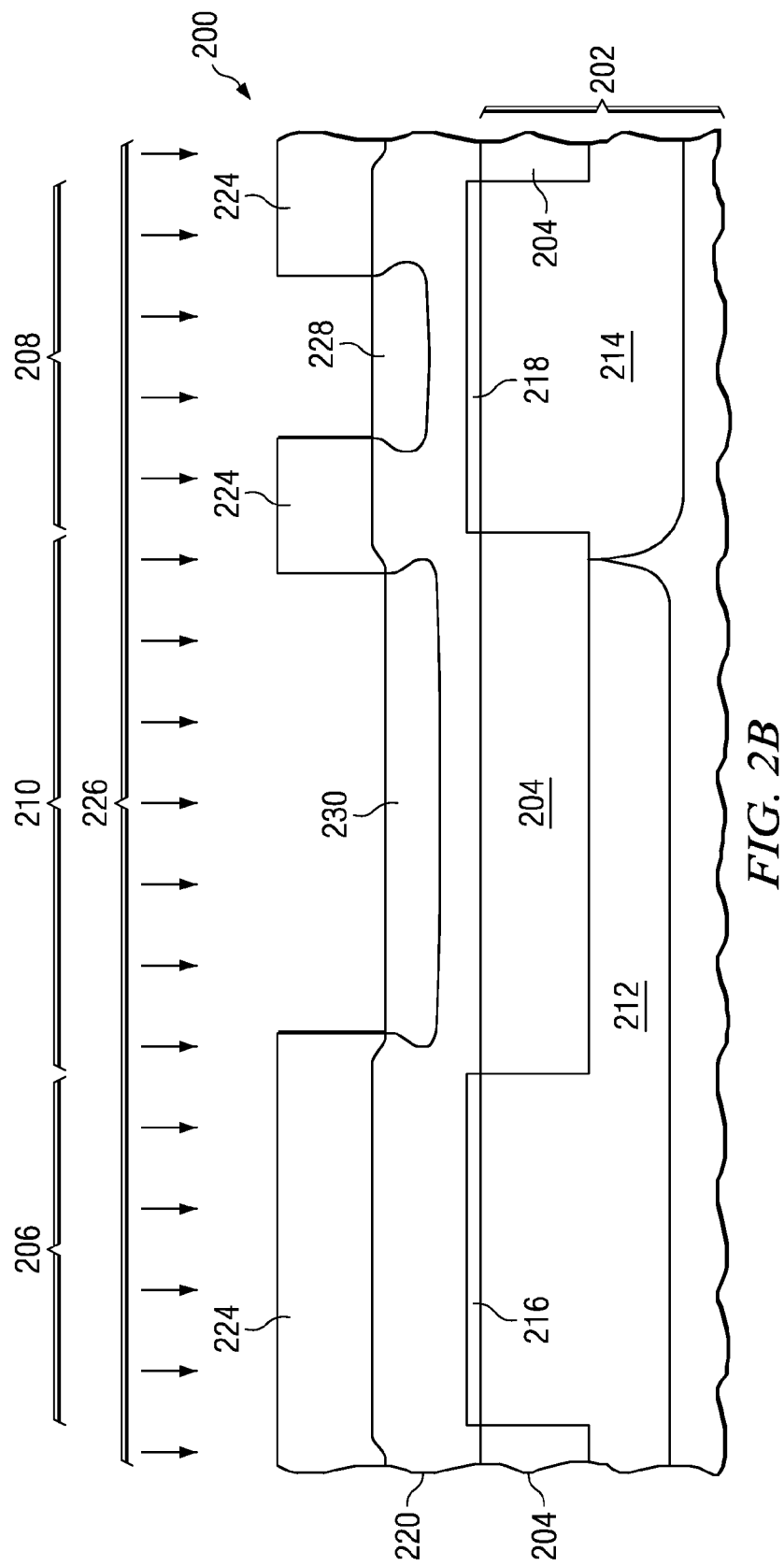
Figure 2C:
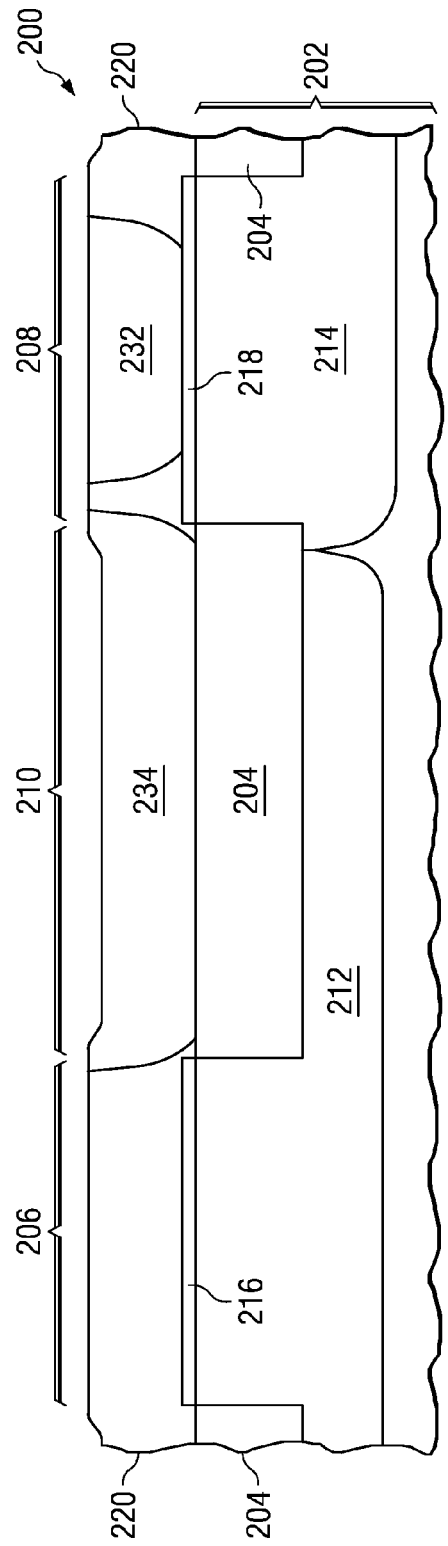

Referring to FIG. 2B, a polysilicon resistor implant photoresist pattern 224 is formed on a top surface of the polysilicon layer 220 which exposes the polysilicon layer 220 in a PMOS gate area in the PMOS area 208 and the resistor area 210. A polysilicon resistor set of p-type dopants 226, typically boron, and possibly gallium and/or indium, is implanted into the PMOS gate area and the resistor area 210 at a total dose between $1 \cdot 10^{14}$ cm$^{-2}$ and $1 \cdot 10^{16}$ cm$^{-2}$ to form a PMOS gate implanted region 228 and a polysilicon resistor implanted region 230 in the polysilicon layer 220, in the PMOS area 208 and the resistor area 210, respectively. The polysilicon resistor implant photoresist pattern 224 is removed, commonly by exposing the IC 200 to an oxygen containing plasma, followed by a wet cleanup to remove any organic residue from the top surface of the polysilicon layer 220.

Referring to FIG. 1C, the IC 200 is annealed to diffuse the polysilicon resistor set of p-type dopants throughout the thickness of the polysilicon layer 220 and activate a portion of the dopants, to form a PMOS gate diffused region 232 and a resistor diffused region 234. Those familiar with integrated circuit fabrication will recognize that the blanket gate set of n-type dopants and the polysilicon resistor set of p-type dopants may be implanted in any order and still obtain the structure described in reference to FIG. 2C.

Figure 2D:
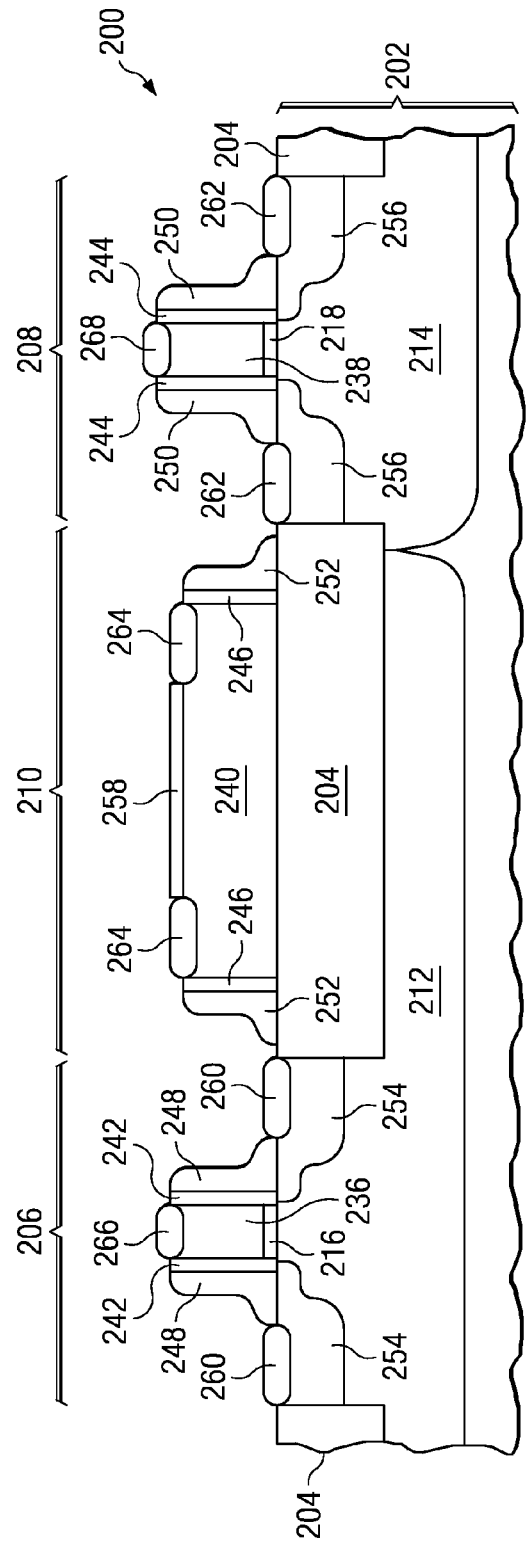

Referring to FIG. 2D, fabrication of the IC 200 continues with formation of an NMOS gate 236, a PMOS gate 238 and a polysilicon resistor body 240, typically by forming a polysilicon etch photoresist pattern on a top surface of the polysilicon layer using known photolithographic methods to expose areas of unwanted polysilicon, and removing unwanted polysilicon using known etching methods. NMOS offset spacers 242 are formed on lateral surfaces of the NMOS gate 236, PMOS offset spacers 244 are formed on lateral surfaces of the PMOS gate 238, and polysilicon resistor offset spacers 246 are formed on lateral surfaces of the polysilicon resistor body 240, as described in reference to FIG. 1D. NMOS sidewall spacers 248 are formed on lateral surfaces of the NMOS offset spacers 242, PMOS sidewall spacers 250 are formed on lateral surfaces of the PMOS offset spacers 244, and polysilicon resistor sidewall spacers 252 are formed on lateral surfaces of the polysilicon resistor offset spacers 246, as described in reference to FIG. 1D. NSD regions 254 are formed in a top region of the p-well 212 adjacent to the NMOS sidewall spacers 248, as described in reference to FIG. 1D. It is common for the NMOS gate 236 to be implanted with NSD dopants during formation of the NSD regions 254. PSD regions 256 are formed in a top region of the n-well 214 adjacent to the PMOS gate sidewall spacers 250, as described in reference to FIG. 1D. It is common for the PMOS gate 238 to be implanted with PSD dopants during formation of the PSD regions 256. A polysilicon resistor silicide block layer 258 is formed by deposition of silicide block material, typically one or more layers of silicon nitride, or one or more layers of silicon dioxide or a stack of silicon nitride and silicon dioxide layers, on the polysilicon resistor body 240, formation of a silicide block photoresist pattern, not shown in FIG. 2D for clarity, on a top surface of the silicide block material using known photolithographic methods, followed by removal of unwanted silicide block material by known etching methods. It is common to perform the deposition and etching processes for forming the NMOS sidewall spacers 248, the PMOS sidewall spacers 250, the polysilicon resistor sidewall spacers 252 and the polysilicon resistor silicide block layer 258 concurrently. NMOS metal silicide layers 260 are formed on top surfaces of the NSD regions 254, PMOS metal silicide layers 262 are formed on top surfaces of the PSD regions 256, resistor contact metal silicide layers 264 are formed on each end of the polysilicon resistor body 240, an optional NMOS gate metal silicide layer 266 is formed on a top surface of the NMOS gate 236 and an optional PMOS gate metal silicide layer 268 is formed on a top surface of the PMOS gate 240, as described in reference to FIG. 1D. Metal silicide is not formed in regions where a silicide block layer, such as the polysilicon resistor silicide block layer 258, is formed on exposed silicon.

During operation of the PMOS transistor, on-state drive current is desirably increased by the presence of the polysilicon resistor set of p-type dopants from the polysilicon resistor ion implantation process, which reduce a depletion region in the PMOS gate 238 adjacent to the PMOS gate dielectric layer 216.

Alternatively, the blanket gate dopants may be converted to p-type dopants, and the NMOS gate 236 may receive additional n-type dopants during an ion implantation process to form a n-type resistor body in a n-type polysilicon resistor, not shown in FIG. 2A through FIG. 2D for clarity, producing a desirable increase in on-state drive current of the NMOS transistor by reducing a depletion region on the NMOS gate 236 adjacent to the NMOS gate dielectric layer 216.

Moreover, a first NMOS transistor in an IC may receive additional n-type dopants during an ion implantation process to form an n-type resistor body in an n-type polysilicon resistor, and a second NMOS transistor of substantially equal size and shape as the first NMOS transistor may not receive additional n-type dopants during the ion implantation process to form the n-type resistor body, thus advantageously providing an NMOS transistor with a different threshold voltage than the first NMOS transistor, without adding fabrication cost or complexity.

In yet another alternative, a first PMOS transistor in an IC may receive additional p-type dopants during an ion implantation process to form an p-type resistor body in an p-type polysilicon resistor, and a second PMOS transistor of substantially equal size and shape as the first PMOS transistor may not receive additional p-type dopants during the ion implantation process to form the p-type resistor body, thus advantageously providing a PMOS transistor with a different threshold voltage than the first PMOS transistor, without adding fabrication cost or complexity.

Figure 3A:
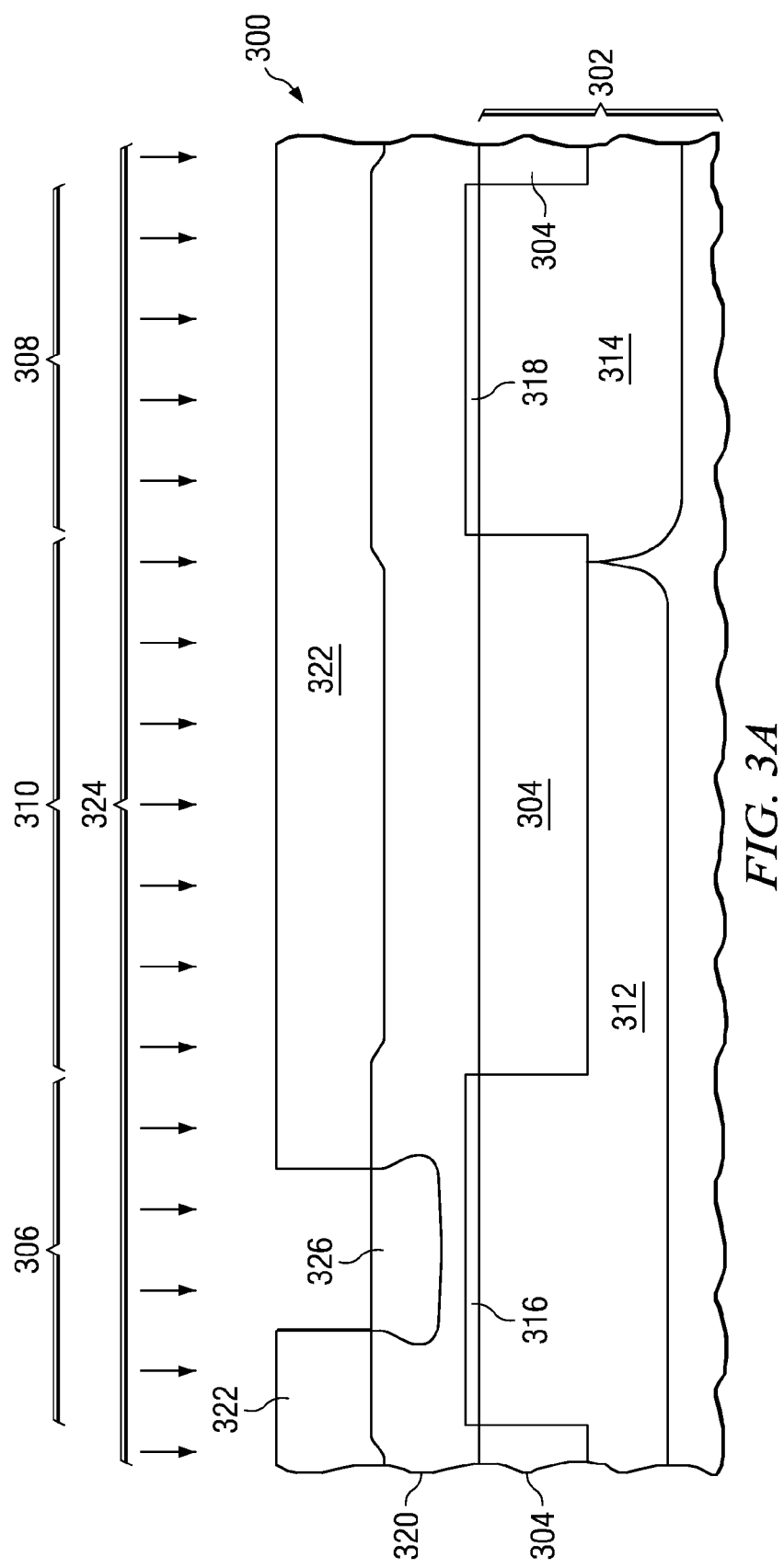
FIG. 3A through FIG. 3D are cross-sections of an IC which include an NMOS transistor, a p-type polysilicon resistor, and a PMOS transistor formed in accordance with a preferred embodiment of the present invention.

FIG. 3A through FIG. 3D are cross-sections of an IC which include an NMOS transistor, a p-type polysilicon resistor and a PMOS transistor formed according to a preferred embodiment of the present invention. Referring to FIG. 3A, the IC 300 is fabricated on a substrate 302 as described in reference to FIG. 1A. Elements of field oxide 304 are formed at a top surface of the substrate 302 as described in reference to FIG.

1A. Openings in the elements of field oxide 304 define an NMOS area 306 for the NMOS transistor and a PMOS area 308 for the PMOS transistor. A contiguous region of field oxide defines a resistor area 310 for the p-type polysilicon resistor. A p-well 312 is formed in the substrate 302 in the NMOS area 306 and the resistor area 310, as described in reference to FIG. 1A. An n-well 314 is formed in the substrate 302 in the PMOS area 308, as described in reference to FIG. 1A. Alternatively, the n-well 314, rather than the p-well 312, may extend under the resistor area 310. An NMOS gate dielectric layer 316 and a PMOS gate dielectric layer 318 are formed on a top surface of the p-well 312 and on a top surface of the n-well 314, respectively, as described in reference to FIG. 1A. A layer of polysilicon 320, commonly between 50 and 250 nanometers thick, is deposited on an existing top surface of the IC 300. An NMOS gate implant photoresist pattern 322 is formed on a top surface of the polysilicon layer 320 which exposes the polysilicon layer 320 in an NMOS gate area of the NMOS area 306. An NMOS gate set of n-type dopants 324, typically phosphorus and arsenic, and possibly antimony, is ion implanted into the NMOS gate area at a total dose between $1 \cdot 10^{14}$ cm$^{-2}$ and $1 \cdot 10^{16}$ cm$^{-2}$ to form a first NMOS gate implanted region 326 in the polysilicon layer 320. The NMOS gate implant photoresist pattern 322 is removed, commonly by exposing the IC 300 to an oxygen containing plasma, followed by a wet cleanup to remove any organic residue from the top surface of the polysilicon layer 320.

Figure 3B:
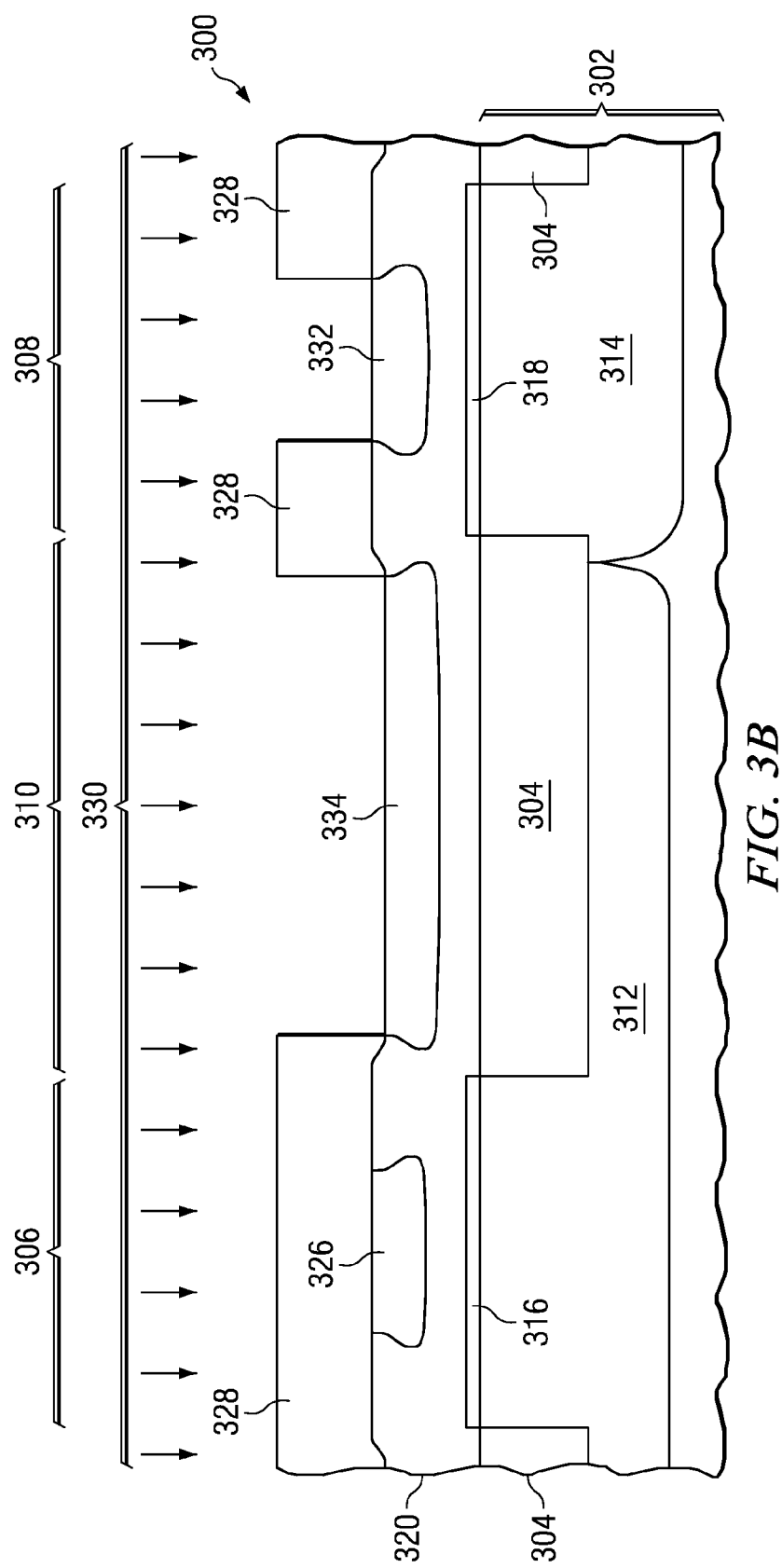

Referring to FIG. 3B, a polysilicon resistor implant photoresist pattern 328 is formed on a top surface of the polysilicon layer 320 which exposes the polysilicon layer 320 in a PMOS gate area in the PMOS area 308 and the resistor area 310. A polysilicon resistor set of p-type dopants 330, typically boron, and possibly gallium and/or indium, is implanted into the PMOS gate area and the resistor area 310 at a total dose between $1 \cdot 10^{14}$ cm$^{-2}$ and $1 \cdot 10^{16}$ cm$^{-2}$ to form a PMOS gate implanted region 332 and a polysilicon resistor implanted region 334 in the polysilicon layer 320, in the PMOS area 308 and the resistor area 310, respectively. The polysilicon resistor implant photoresist pattern 328 is removed, commonly by exposing the IC 300 to an oxygen containing plasma, followed by a wet cleanup to remove any organic residue from the top surface of the polysilicon layer 320.

Figure 3C:
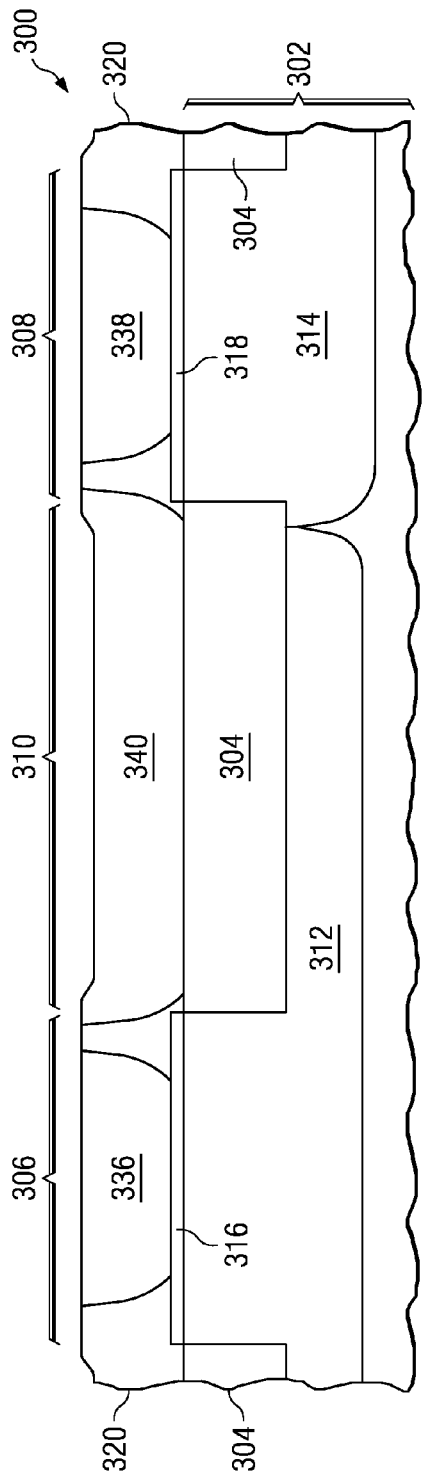

Referring to FIG. 3C, the IC 300 is annealed to diffuse NMOS gate n-type dopants and the polysilicon resistor p-type dopants throughout the thickness of the polysilicon layer 320 and activate a portion of the dopants, to form an NMOS gate diffused region 336, a PMOS gate diffused region 338 and a resistor diffused region 340. Those familiar with integrated circuit fabrication will recognize that the NMOS gate set of n-type dopants and the polysilicon resistor set of p-type dopants may be implanted in any order and still obtain the structure described in reference to FIG. 3C.

Figure 3D:
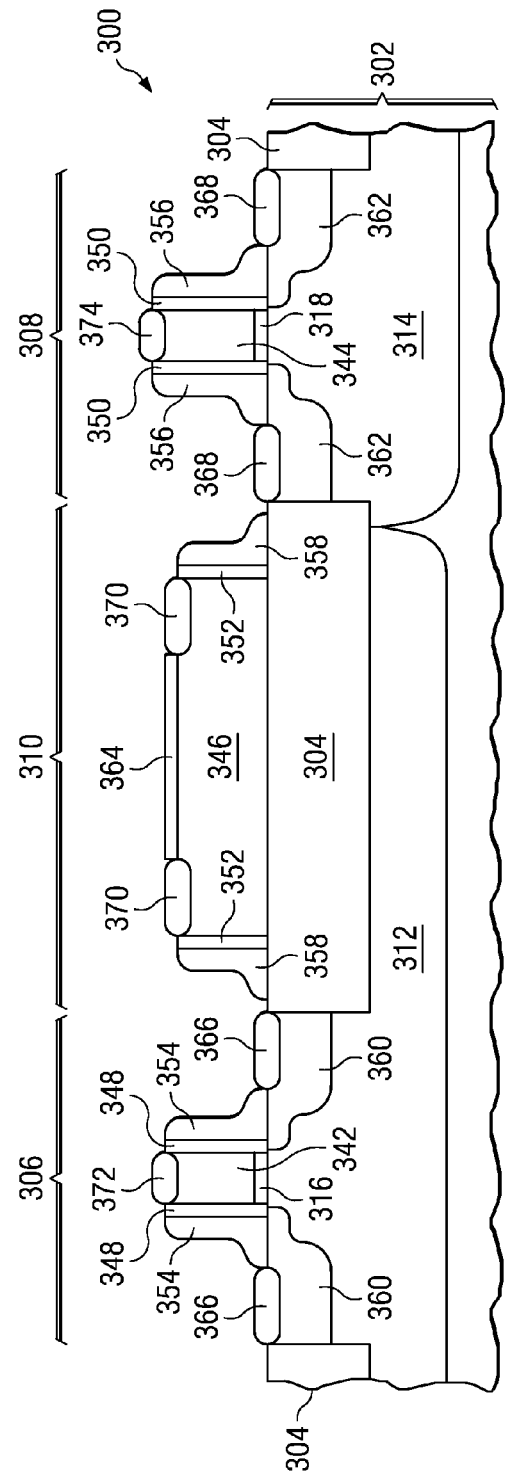

Referring to FIG. 3D, fabrication of the IC 300 continues with formation of an NMOS gate 342, a PMOS gate 344 and a polysilicon resistor body 346, typically by forming a polysilicon etch photoresist pattern on a top surface of the polysilicon layer using known photolithographic methods to expose areas of unwanted polysilicon, and removing unwanted polysilicon using known etching methods. NMOS offset spacers 348 are formed on lateral surfaces of the NMOS gate 342, PMOS offset spacers 350 are formed on lateral surfaces of the PMOS gate 344, and polysilicon resistor offset spacers 352 are formed on lateral surfaces of the polysilicon resistor body 346, as described in reference to FIG. 1D. NMOS sidewall spacers 354 are formed on lateral surfaces of the NMOS offset spacers 348, PMOS sidewall spacers 356 are formed on lateral surfaces of the PMOS offset spacers 350, and polysilicon resistor sidewall spacers 358 are formed on lateral surfaces of the polysilicon resistor offset spacers 352, as described in reference to FIG. 1D. NSD regions 360 are formed in a top region of the p-well 312 adjacent to the NMOS sidewall spacers 354, as described in reference to FIG. 1D. It is common for the NMOS gate 342 to be implanted with NSD dopants during formation of the NSD regions 360. PSD regions 362 are formed in a top region of the n-well 314 adjacent to the PMOS gate sidewall spacers 356, as described in reference to FIG. 1D. It is common for the PMOS gate 344 to be implanted with PSD dopants during formation of the PSD regions 362. A polysilicon resistor silicide block layer 364 is formed by deposition of silicide block material, typically one or more layers of silicon nitride, or one or more layers of silicon dioxide or a stack of silicon nitride and silicon dioxide layers, on the polysilicon resistor body 346, formation of a silicide block photoresist pattern, not shown in FIG. 3D for clarity, on a top surface of the silicide block material using known photolithographic methods, followed by removal of unwanted silicide block material by known etching methods. It is common to perform the deposition and etching processes for forming the NMOS sidewall spacers 354, the PMOS sidewall spacers 356, the polysilicon resistor sidewall spacers 358 and the polysilicon resistor silicide block layer 364 concurrently. NMOS metal silicide layers 366 are formed on top surfaces of the NSD regions 360, PMOS metal silicide layers 368 are formed on top surfaces of the PSD regions 362, resistor contact metal silicide layers 370 are formed on each end of the polysilicon resistor body 344, an optional NMOS gate metal silicide layer 372 is formed on a top surface of the NMOS gate 342 and an optional PMOS gate metal silicide layer 374 is formed on a top surface of the PMOS gate 346, as described in reference to FIG. 1D. Metal silicide is not formed in regions where a silicide block layer, such as the polysilicon resistor silicide block layer 364, is formed on exposed silicon.

During operation of the PMOS transistor, a desired balance of on-state drive current and off-state leakage current is provided by the presence of the polysilicon resistor set of p-type dopants from the polysilicon resistor ion implantation process, which establishes a desired doping concentration in the PMOS gate 344.

Alternatively, an undoped PMOS gate area may receive p-type dopants during an ion implantation process to form a p-type resistor body in a p-type polysilicon resistor, providing a desired balance of on-state drive current and off-state leakage current in a PMOS transistor by establishing a desired doping concentration in a PMOS gate of the PMOS transistor.

Moreover, a first undoped NMOS gate area of a first NMOS transistor in an IC may receive n-type dopants during an ion implantation process to form an n-type resistor body in an n-type polysilicon resistor, and a second undoped NMOS gate area of a second NMOS transistor of substantially equal size and shape as the first NMOS transistor may not receive n-type dopants during the ion implantation process to form the n-type resistor body, thus advantageously providing an NMOS transistor with a different threshold voltage than the first NMOS transistor, without adding fabrication cost or complexity.

In yet another alternative, a first undoped PMOS gate area of a first PMOS transistor in an IC may receive p-type dopants during an ion implantation process to form an p-type resistor body in an p-type polysilicon resistor, and a second undoped PMOS gate area of a second PMOS transistor of substantially equal size and shape as the first PMOS transistor may not receive n-type dopants during the ion implantation process to form the n-type resistor body, thus advantageously providing a PMOS transistor with a different threshold voltage than the first PMOS transistor, without adding fabrication cost or complexity.

Figure 4A:
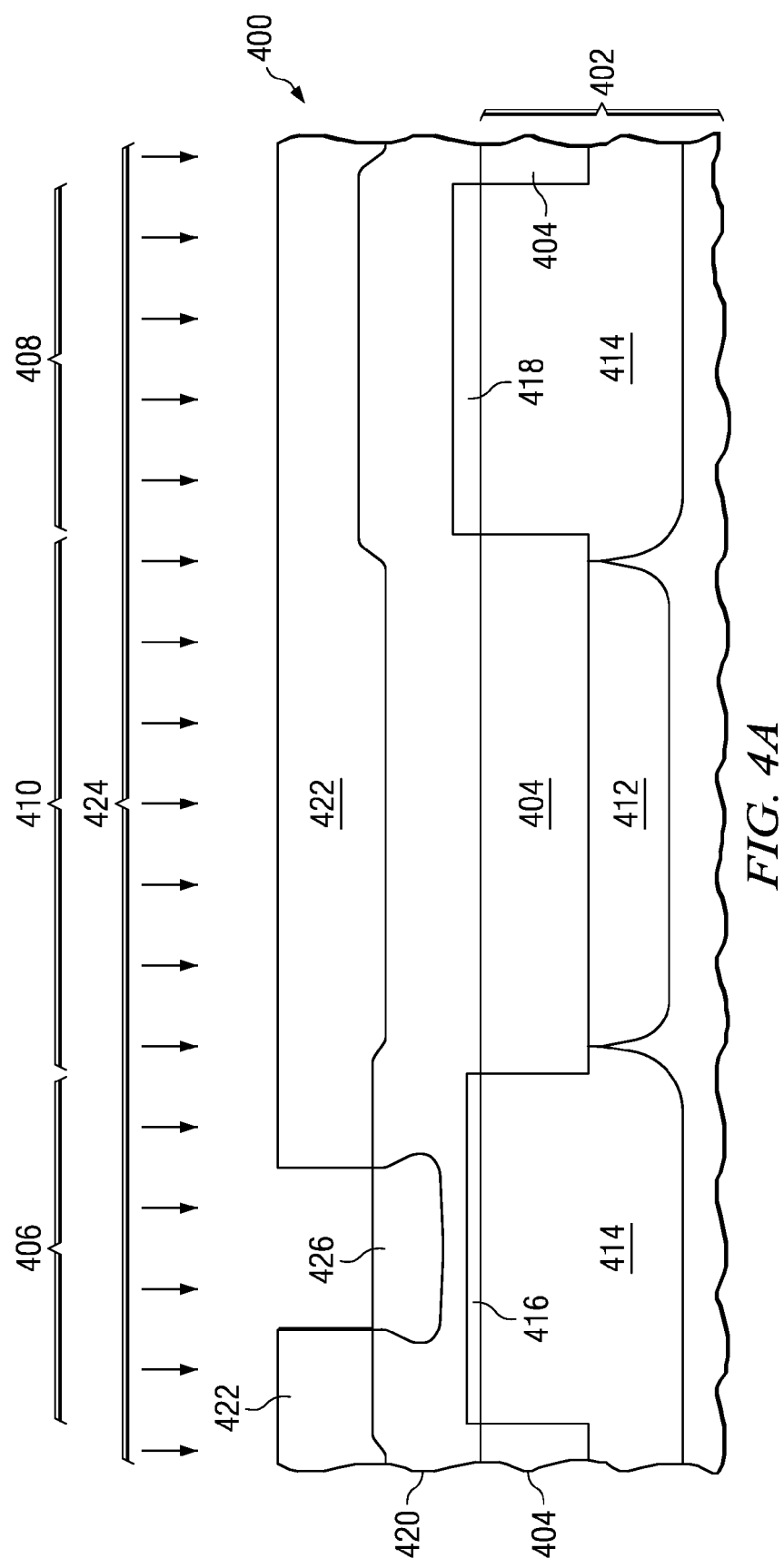

FIG. 4A through FIG. 4D are cross-sections of an IC which include a low voltage PMOS transistor, a p-type polysilicon resistor and a high voltage PMOS transistor formed according to a preferred embodiment of the present invention. Referring to FIG. 4A, the IC 400 is fabricated on a substrate 402 as described in reference to FIG. 1A. Elements of field oxide 404 are formed at a top surface of the substrate 402 as described in reference to FIG. 1A. Openings in the elements of field oxide 404 define a low voltage PMOS area 406 for the low voltage PMOS transistor and a high voltage PMOS area 408 for the high voltage PMOS transistor. A contiguous region of field oxide defines a resistor area 410 for the p-type polysilicon resistor. A p-well 412 is formed in the substrate 402 in the resistor area 410, as described in reference to FIG. 1A. An n-well 414 is formed in the substrate 402 in the low voltage PMOS area 406 and in the high voltage PMOS area 408, as described in reference to FIG. 1A. Alternatively, the n-well 414, rather than the p-well 412, may extend under the resistor area 410. A low voltage PMOS gate dielectric layer 416 is formed on a top surface of the n-well 414 in the low voltage PMOS area 406 as described in reference to FIG. 1A. A high voltage PMOS gate dielectric layer 418, typically silicon dioxide, nitrogen doped silicon dioxide, silicon oxy-nitride, hafnium oxide, layers of silicon dioxide and silicon nitride, or other insulating material, and typically thicker than the low voltage PMOS gate dielectric layer 416, is formed on a top surface of the n-well 414 in the high voltage PMOS area 408. A layer of polysilicon 420, commonly between 50 and 250 nanometers thick, is deposited on an existing top surface of the IC 400. A low voltage PMOS gate implant photoresist pattern 422 is formed on a top surface of the polysilicon layer 420 which exposes the polysilicon layer 420 in a low voltage PMOS gate area of the low voltage PMOS area 406. A low voltage PMOS gate set of p-type dopants 424, typically boron, and possibly gallium and/or indium, is ion implanted into the low voltage PMOS gate area at a total dose between $1 \cdot 10^{14}$ cm$^{-2}$ and $1 \cdot 10^{16}$ cm$^{-2}$ to form a low voltage PMOS gate implanted region 426 in the polysilicon layer 420. The low voltage PMOS gate implant photoresist pattern 422 is removed, commonly by exposing the IC 400 to an oxygen containing plasma, followed by a wet cleanup to remove any organic residue from the top surface of the polysilicon layer 420.

Figure 4B:
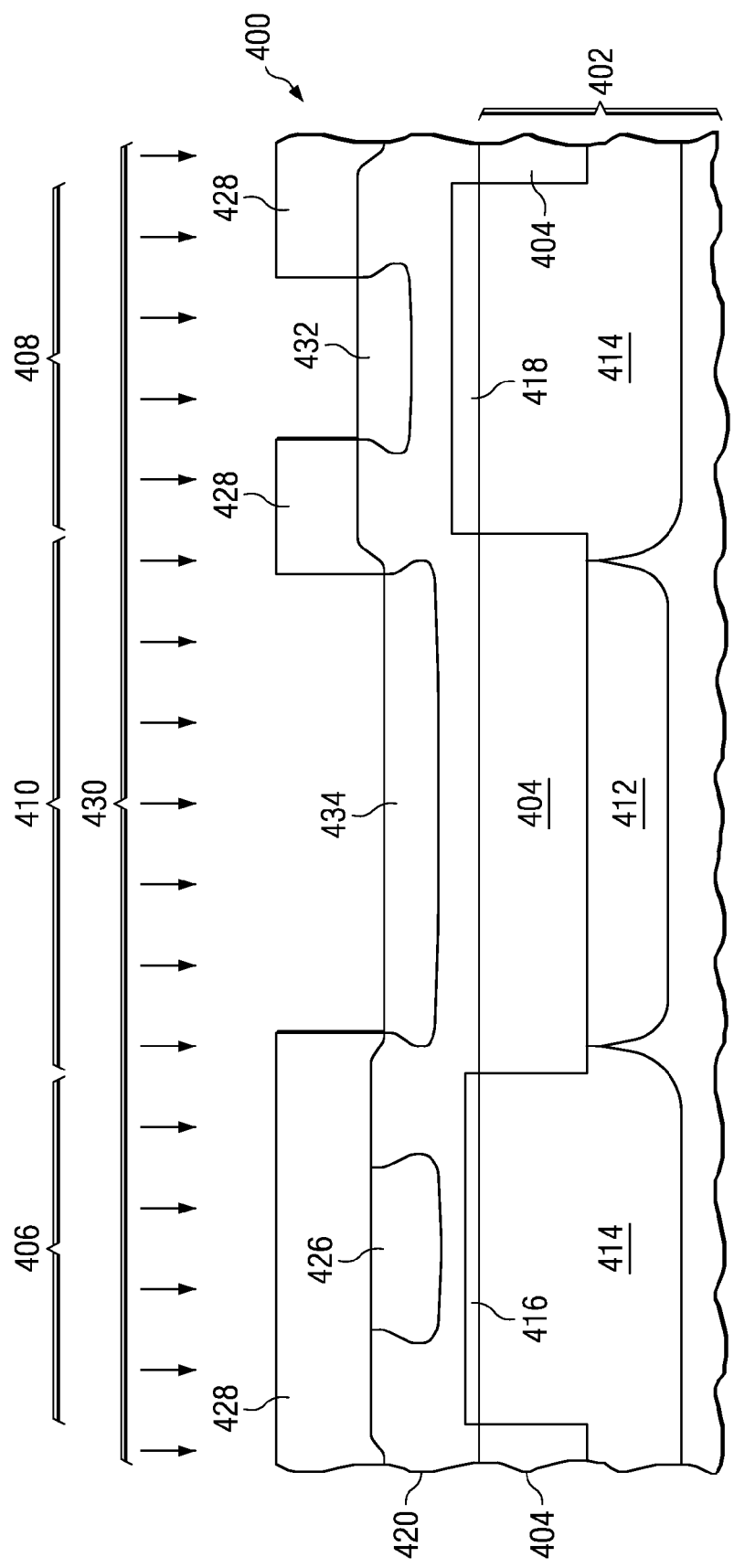

Referring to FIG. 4B, a polysilicon resistor implant photoresist pattern 428 is formed on a top surface of the polysilicon layer 420 which exposes the polysilicon layer 420 in a high voltage PMOS gate area in the high voltage PMOS area 408 and the resistor area 410. A polysilicon resistor set of p-type dopants 430, typically boron, and possibly gallium and/or indium, is implanted into the high voltage PMOS gate area and the resistor area 410 at a total dose between $1 \cdot 10^{14}$ cm$^{-2}$ and $1 \cdot 10^{16}$ cm$^{-2}$ to form a high voltage PMOS gate implanted region 432 and a polysilicon resistor implanted region 434 in the polysilicon layer 420, in the high voltage PMOS area 408 and the resistor area 410, respectively. The polysilicon resistor implant photoresist pattern 428 is removed, commonly by exposing the IC 400 to an oxygen containing plasma, followed by a wet cleanup to remove any organic residue from the top surface of the polysilicon layer 420.

Referring to FIG. 4C, the IC 400 is annealed to diffuse low voltage PMOS gate p-type dopants and the polysilicon resistor p-type dopants throughout the thickness of the polysilicon layer 420 and activate a portion of the dopants, to form a low voltage PMOS gate diffused region 436, a high voltage PMOS gate diffused region 438 and a resistor diffused region 440. Those familiar with integrated circuit fabrication will recognize that the low voltage PMOS gate p-type dopants and the polysilicon resistor set of p-type dopants may be implanted in any order and still obtain the structure described in reference to FIG. 4C.

Referring to FIG. 4D, fabrication of the IC 400 continues with formation of an low voltage PMOS gate 442, a high voltage PMOS gate 444 and a polysilicon resistor body 446, typically by forming a polysilicon etch photoresist pattern on a top surface of the polysilicon layer using known photolithographic methods to expose areas of unwanted polysilicon, and removing unwanted polysilicon using known etching methods. Low voltage PMOS offset spacers 448 are formed on lateral surfaces of the low voltage PMOS gate 442, high voltage PMOS offset spacers 450 are formed on lateral surfaces of the high voltage PMOS gate 444, and polysilicon resistor offset spacers 452 are formed on lateral surfaces of the polysilicon resistor body 446, as described in reference to FIG. 1D. Low voltage PMOS sidewall spacers 454 are formed on lateral surfaces of the low voltage PMOS offset spacers 448, high voltage PMOS sidewall spacers 456 are formed on lateral surfaces of the high voltage PMOS offset spacers 450, and polysilicon resistor sidewall spacers 458 are formed on lateral surfaces of the polysilicon resistor offset spacers 452, as described in reference to FIG. 1D. Low voltage PSD regions 460 are formed in a top region of the n-well 414 adjacent to the low voltage PMOS sidewall spacers 454, as described in reference to FIG. 1D. It is common for the low voltage PMOS gate 442 to be implanted with low voltage PSD dopants during formation of the low voltage PSD regions 460. High voltage PSD regions 462 are formed in a top region of the n-well 414 adjacent to the high voltage PMOS gate sidewall spacers 456, as described in reference to FIG. 1D. It is common for the high voltage PMOS gate 444 to be implanted with high voltage PSD dopants during formation of the high voltage PSD regions 462. It is common to ion implant a portion of the low voltage PSD dopants and a portion of the high voltage PSD dopants concurrently. A polysilicon resistor silicide block layer 464 is formed by deposition of silicide block material, typically one or more layers of silicon nitride, or one or more layers of silicon dioxide or a stack of silicon nitride and silicon dioxide layers, on the polysilicon resistor body 446, formation of a silicide block photoresist pattern, not shown in FIG. 4D for clarity, on a top surface of the silicide block material using known photolithographic methods, followed by removal of unwanted silicide block material by known etching methods. It is common to perform the deposition and etching processes for forming the low voltage PMOS sidewall spacers 454, the high voltage PMOS sidewall spacers 456, the polysilicon resistor sidewall spacers 458 and the polysilicon resistor silicide block layer 464 concurrently. Low voltage PMOS metal silicide layers 466 are formed on top surfaces of the low voltage PSD regions 460, high voltage PMOS metal silicide layers 468 are formed on top surfaces of the high voltage PSD regions 462, resistor contact metal silicide layers 470 are formed on each end of the polysilicon resistor body 444, an optional low voltage PMOS gate metal silicide layer 472 is formed on a top surface of the low voltage PMOS gate 442 and an optional high voltage PMOS gate metal silicide layer 474 is formed on a top surface of the high voltage PMOS gate 446, as described in reference to FIG. 1D. Metal silicide is not formed in regions where a silicide block layer, such as the polysilicon resistor silicide block layer 464, is formed on exposed silicon.

During operation of the high voltage PMOS transistor, a desired balance of on-state drive current and off-state leakage current is provided by the presence of the polysilicon resistor set of p-type dopants from the polysilicon resistor ion implantation process, which establishes a desired doping concentration in the high voltage PMOS gate 444.

Alternatively, an undoped high voltage NMOS gate area may receive n-type dopants during an ion implantation process to form an n-type resistor body in an n-type polysilicon resistor, providing a desired balance of on-state drive current and off-state leakage current in a high voltage NMOS transistor by establishing a desired doping concentration in a high voltage NMOS gate of the high voltage NMOS transistor.

Figure 5A:
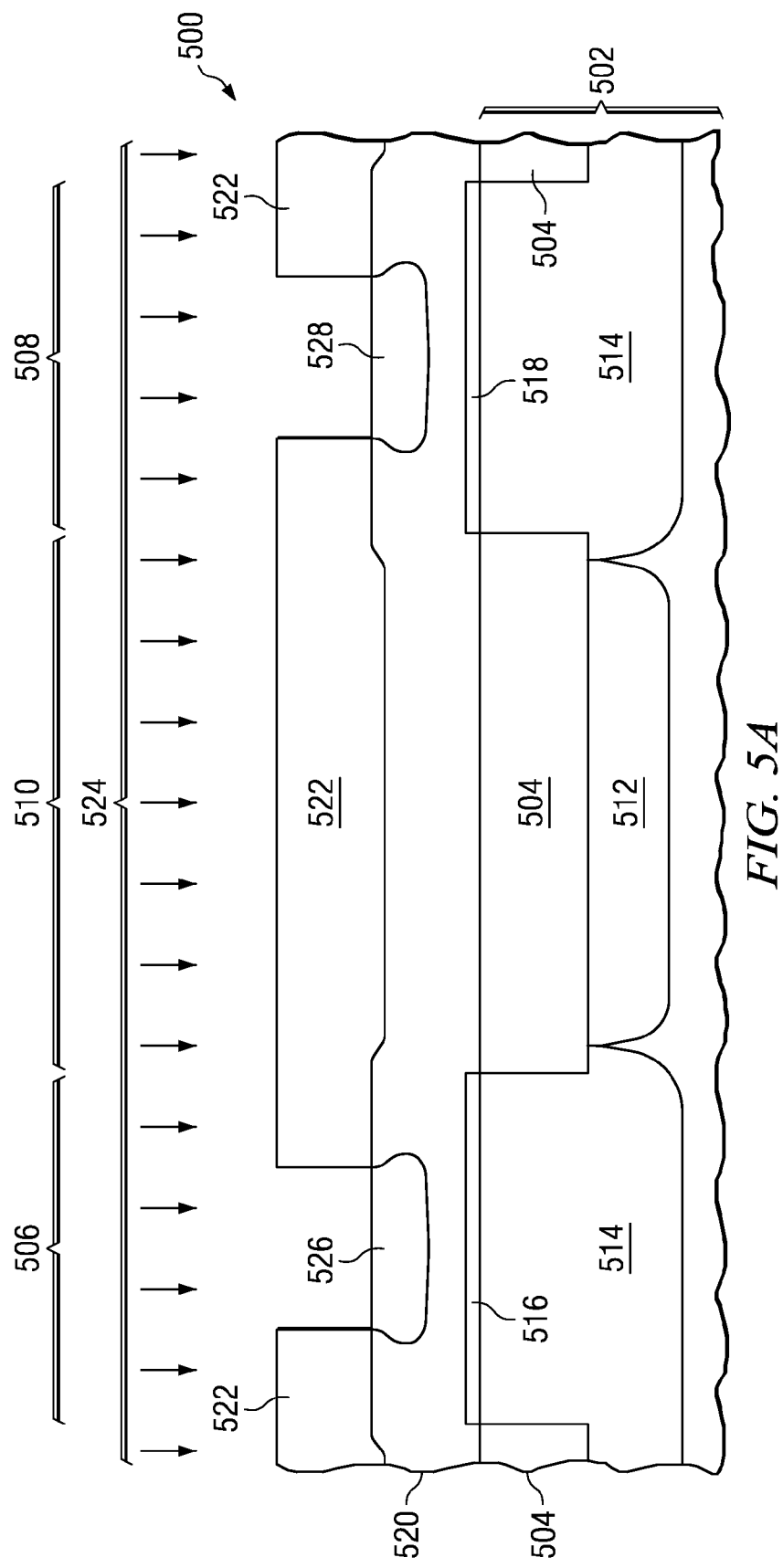
FIG. 5A through FIG. 5D are cross-sections of an IC which include a wide PMOS transistor, a p-type polysilicon resistor, and a narrow PMOS transistor formed in accordance with a preferred embodiment of the present invention.

FIG. 5A through FIG. 5D are cross-sections of an IC which include a wide PMOS transistor, a p-type polysilicon resistor and a narrow PMOS transistor formed according to a preferred embodiment of the present invention. A gate length of the wide PMOS transistor is substantially equal to a gate length of the narrow PMOS transistor. A channel width of the wide PMOS transistor is significantly more than three times the gate length of the wide PMOS transistor. A channel width of the narrow PMOS transistor is less than three times the gate length of the narrow PMOS transistor. Referring to FIG. 5A, the IC 500 is fabricated on a substrate 502 as described in reference to FIG. 1A. Elements of field oxide 504 are formed at a top surface of the substrate 502 as described in reference to FIG. 1A. Openings in the elements of field oxide 504 define a wide PMOS area 506 for the wide PMOS transistor and a narrow PMOS area 508 for the narrow PMOS transistor. A contiguous region of field oxide defines a resistor area 510 for the p-type polysilicon resistor. A p-well 512 is formed in the substrate 502 in the resistor area 510, as described in reference to FIG. 1A. An n-well 514 is formed in the substrate 502 in the wide PMOS area 506 and in the narrow PMOS area 508, as described in reference to FIG. 1A. Alternatively, the n-well 514, rather than the p-well 512, may extend under the resistor area 510. A wide PMOS gate dielectric layer 516 and a narrow PMOS gate dielectric layer 518 are formed on a top surface of the n-well 514 in the wide PMOS area 506 and the narrow PMOS area 508, respectively, as described in reference to FIG. 1A. It is common to form the wide PMOS gate dielectric layer 516 and the narrow PMOS gate dielectric layer 518 concurrently. A layer of polysilicon 520, commonly between 50 and 250 nanometers thick, is deposited on an existing top surface of the IC 500. A PMOS gate implant photoresist pattern 522 is formed on a top surface of the polysilicon layer 520 which exposes the polysilicon layer 520 in a wide PMOS gate area of the wide PMOS area 506 and in a narrow PMOS gate area of the narrow PMOS area 508. A PMOS gate set of p-type dopants 524, typically boron, and possibly gallium and/or indium, is ion implanted into the wide PMOS gate area and the narrow PMOS gate area at a total dose between $1 \cdot 10^{14}$ cm$^{-2}$ and $1 \cdot 10^{16}$ cm$^{-2}$ to form a wide PMOS gate implanted region 526 and a narrow PMOS gate implanted region 528 in the polysilicon layer 520. The PMOS gate implant photoresist pattern 522 is removed, commonly by exposing the IC 500 to an oxygen containing plasma, followed by a wet cleanup to remove any organic residue from the top surface of the polysilicon layer 520.

Figure 5B:
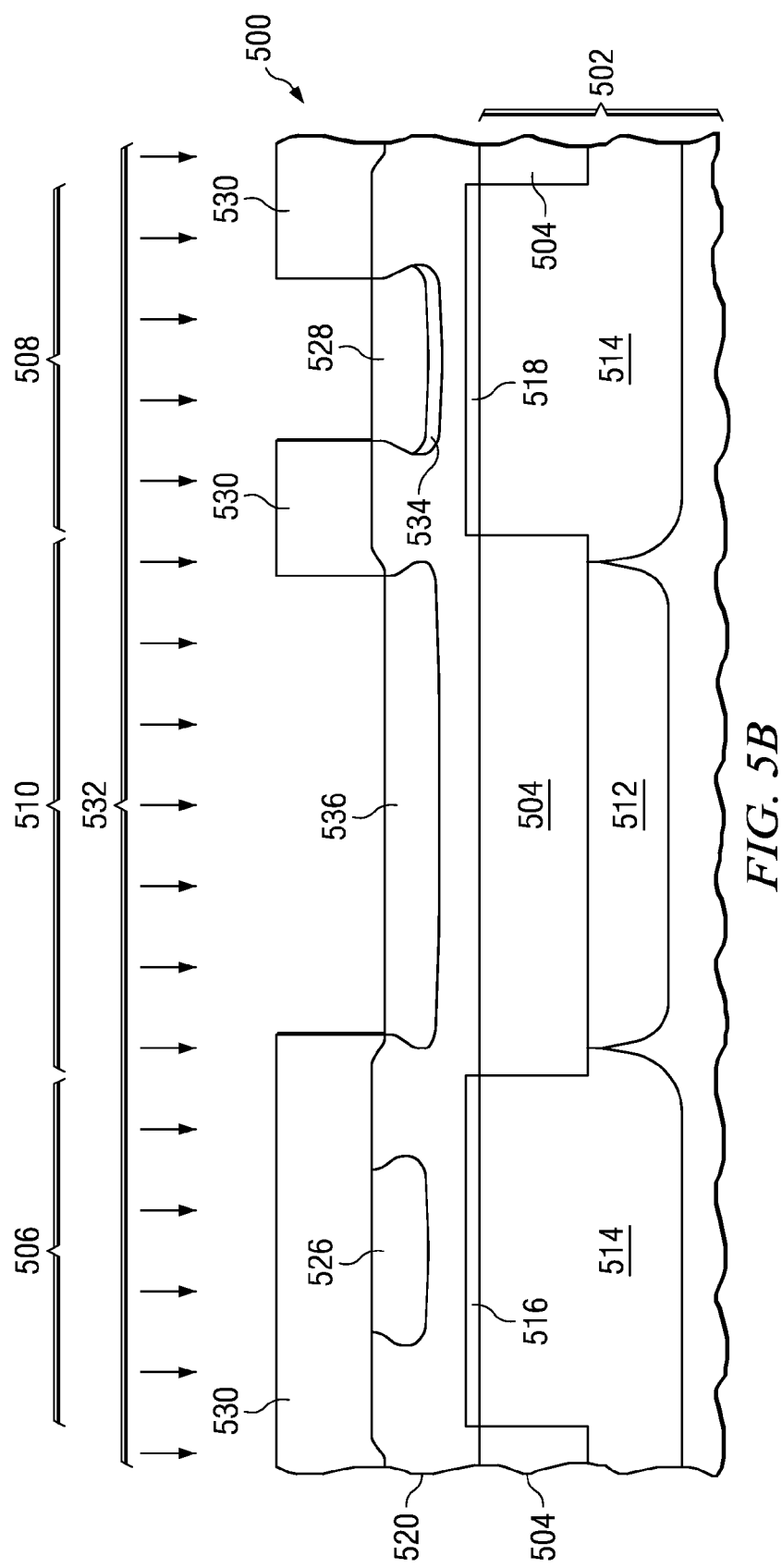

Referring to FIG. 5B, a polysilicon resistor implant photoresist pattern 530 is formed on a top surface of the polysilicon layer 520 which exposes the polysilicon layer 520 in the narrow PMOS gate area in the narrow PMOS area 508 and the resistor area 510. A polysilicon resistor set of p-type dopants 532, typically boron, and possibly gallium and/or indium, is implanted into the narrow PMOS gate area and the resistor area 510 at a total dose between $1 \cdot 10^{14}$ cm$^{-2}$ and $1 \cdot 10^{16}$ cm$^{-2}$ to form a narrow PMOS gate implanted region 534 and a polysilicon resistor implanted region 536 in the polysilicon layer 520, in the narrow PMOS area 508 and the resistor area 510, respectively. The polysilicon resistor implant photoresist pattern 530 is removed, commonly by exposing the IC 500 to an oxygen containing plasma, followed by a wet cleanup to remove any organic residue from the top surface of the polysilicon layer 520.

Figure 5C:
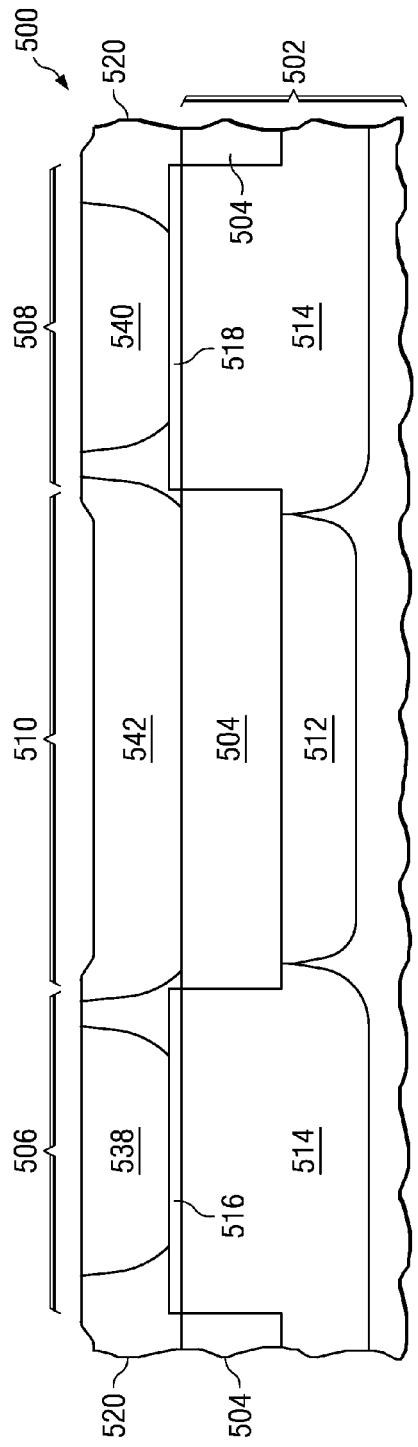

Referring to FIG. 5C, the IC 500 is annealed to diffuse the PMOS gate p-type dopants and the polysilicon resistor p-type dopants throughout the thickness of the polysilicon layer 520 and activate a portion of the dopants, to form a wide PMOS gate diffused region 538, a high voltage PMOS gate diffused region 540 and a resistor diffused region 542. Those familiar with integrated circuit fabrication will recognize that the PMOS gate p-type dopants and the polysilicon resistor set of p-type dopants may be implanted in any order and still obtain the structure described in reference to FIG. 5C.

Figure 5D:
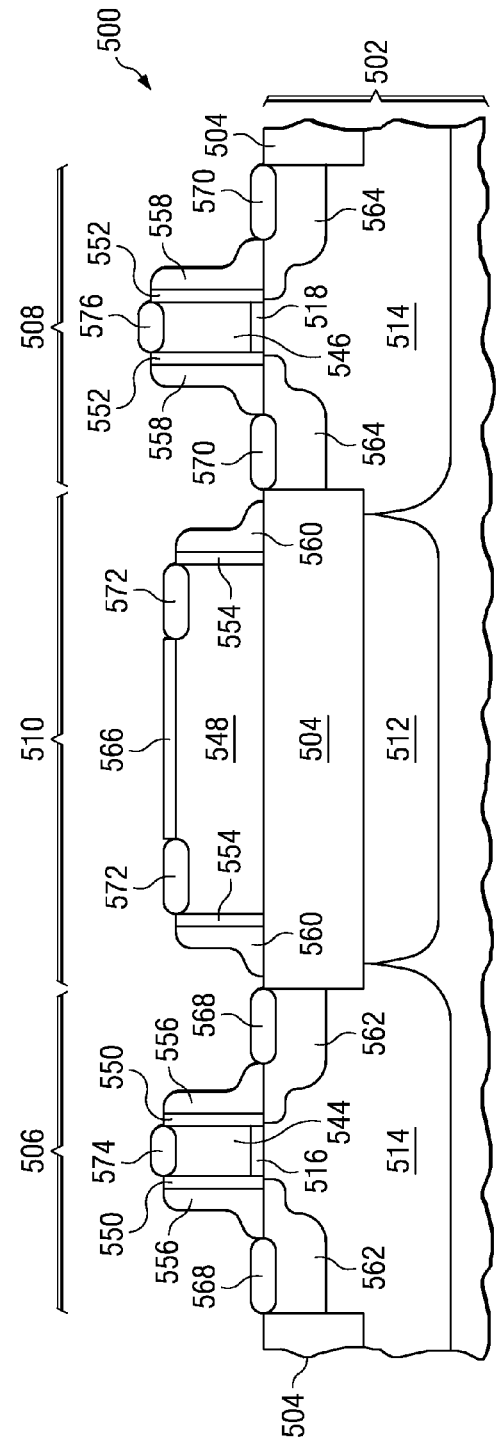

Referring to FIG. 5D, fabrication of the IC 500 continues with formation of a wide PMOS gate 544, a narrow PMOS gate 546 and a polysilicon resistor body 548, typically by forming a polysilicon etch photoresist pattern on a top surface of the polysilicon layer using known photolithographic methods to expose areas of unwanted polysilicon, and removing unwanted polysilicon using known etching methods. Wide PMOS offset spacers 550 are formed on lateral surfaces of the wide PMOS gate 544, narrow PMOS offset spacers 552 are formed on lateral surfaces of the narrow PMOS gate 546, and polysilicon resistor offset spacers 554 are formed on lateral surfaces of the polysilicon resistor body 548, as described in reference to FIG. 1D. Wide PMOS sidewall spacers 556 are formed on lateral surfaces of the wide PMOS offset spacers 550, narrow PMOS sidewall spacers 558 are formed on lateral surfaces of the narrow PMOS offset spacers 552, and polysilicon resistor sidewall spacers 560 are formed on lateral surfaces of the polysilicon resistor offset spacers 554, as described in reference to FIG. 1D. Wide PSD regions 562 are formed in a top region of the n-well 514 adjacent to the wide PMOS sidewall spacers 556, as described in reference to FIG. 1D. It is common for the wide PMOS gate 544 to be implanted with wide PSD dopants during formation of the wide PSD regions 562. Narrow PSD regions 564 are formed in a top region of the n-well 514 adjacent to the narrow PMOS gate sidewall spacers 558, as described in reference to FIG. 1D. It is common for the narrow PMOS gate 546 to be implanted with narrow PSD dopants during formation of the narrow PSD regions 564. It is common to ion implant a portion of the wide PSD dopants and a portion of the narrow PSD dopants concurrently. A polysilicon resistor silicide block layer 566 is formed by deposition of silicide block material, typically one or more layers of silicon nitride, or one or more layers of silicon dioxide or a stack of silicon nitride and silicon dioxide layers, on the polysilicon resistor body 548, formation of a silicide block photoresist pattern, not shown in FIG. 5D for clarity, on a top surface of the silicide block material using known photolithographic methods, followed by removal of unwanted silicide block material by known etching methods. It is common to perform the deposition and etching processes for forming the wide PMOS sidewall spacers 556, the narrow PMOS sidewall spacers 558, the polysilicon resistor sidewall spacers 560 and the polysilicon resistor silicide block layer 566 concurrently. Wide PMOS metal silicide layers 568 are formed on top surfaces of the wide PSD regions 562, narrow PMOS metal silicide layers 570 are formed on top surfaces of the narrow PSD regions 564, resistor contact metal silicide layers 572 are formed on each end of the polysilicon resistor body 546, an optional wide PMOS gate metal silicide layer 574 is formed on a top surface of the wide PMOS gate 544 and an optional narrow PMOS gate metal silicide layer 576 is formed on a top surface of the narrow PMOS gate 548, as described in reference to FIG. 1D. Metal silicide is not formed in regions where a silicide block layer, such as the polysilicon resistor silicide block layer 566, is formed on exposed silicon.

During operation of the narrow PMOS transistor, a desired threshold voltage is provided by the presence of the polysilicon resistor set of p-type dopants from the polysilicon resistor ion implantation process, which establishes a desired work function in the narrow PMOS gate 546.

Alternatively, a narrow NMOS gate area may receive n-type dopants during an ion implantation process to form an n-type resistor body in an n-type polysilicon resistor, providing a desired threshold voltage in a narrow NMOS transistor by establishing a desired work function in a narrow NMOS gate of the narrow NMOS transistor.

Figure 6A:
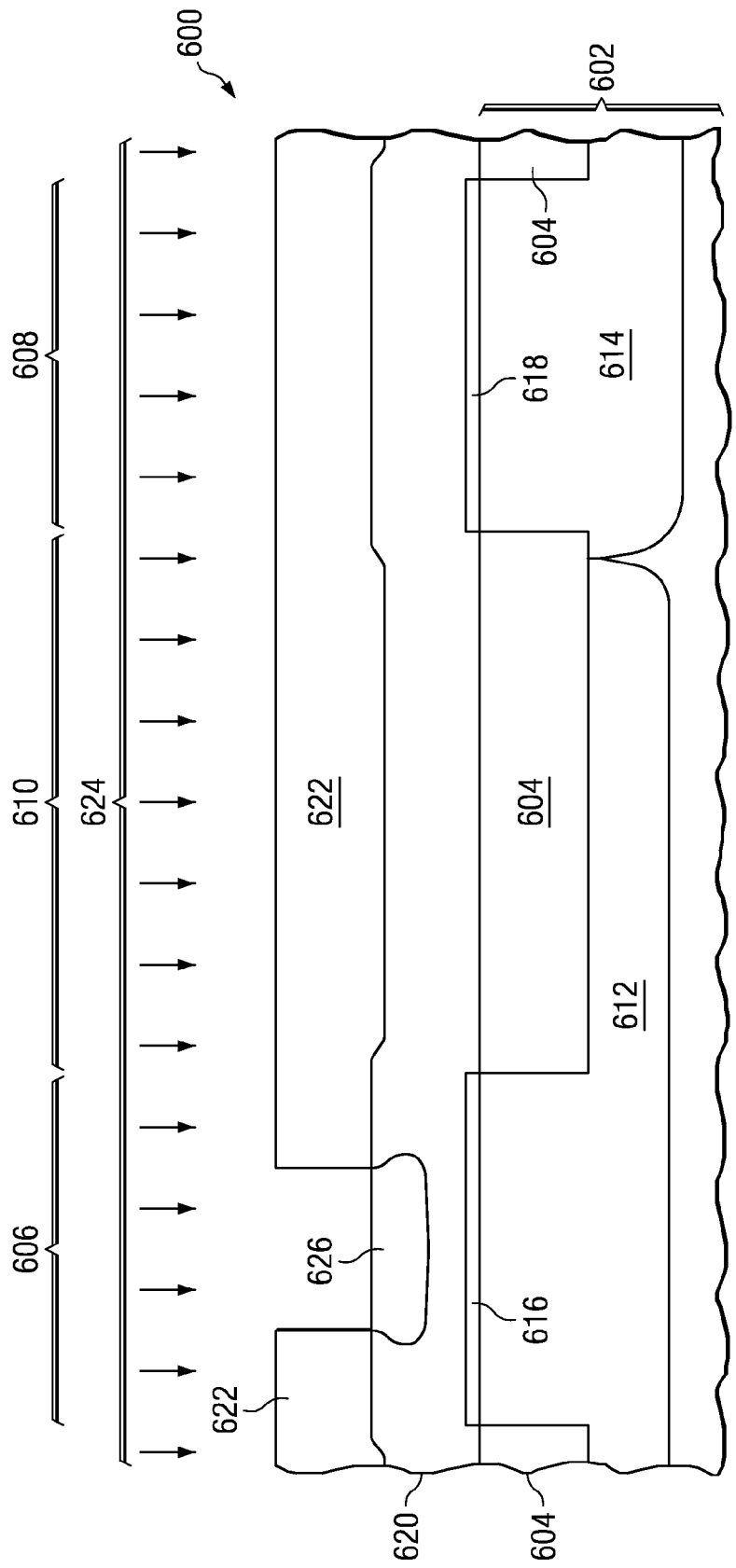
FIG. 6A through FIG. 6D are cross-sections of an IC which include an NMOS transistor, a p-type polysilicon resistor, and a PMOS transistor formed in accordance with a preferred embodiment of the present invention.

FIG. 6A through FIG. 6D are cross-sections of an IC which include an NMOS transistor, a p-type polysilicon resistor and a PMOS transistor formed according to a preferred embodiment of the present invention. Referring to FIG. 6A, the IC 600 is fabricated on a substrate 602 as described in reference to FIG. 1A. Elements of field oxide 604 are formed at a top surface of the substrate 602 as described in reference to FIG. 1A. Openings in the elements of field oxide 604 define an NMOS area 606 for the NMOS transistor and a PMOS area 608 for the PMOS transistor. A contiguous region of field oxide defines a resistor area 610 for the p-type polysilicon resistor. A p-well 612 is formed in the substrate 602 in the NMOS area 606 and the resistor area 610, as described in reference to FIG. 1A. An n-well 614 is formed in the substrate 602 in the PMOS area 608, as described in reference to FIG. 1A. Alternatively, the n-well 614, rather than the p-well 612, may extend under the resistor area 610. An NMOS gate dielectric layer 616 and a PMOS gate dielectric layer 618 are formed on a top surface of the p-well 612 in the NMOS area 606 and on a top surface of the n-well 614 in the PMOS area 608, respectively, as described in reference to FIG. 1A. It is common to form the NMOS gate dielectric layer 616 and the PMOS gate dielectric layer 618 concurrently. A layer of polysilicon 620, commonly between 50 and 250 nanometers thick, is deposited on an existing top surface of the IC 600. An NMOS gate implant photoresist pattern 622 is formed on a top surface of the polysilicon layer 620 which exposes the polysilicon layer 620 in an NMOS gate area of the NMOS area 606. An NMOS gate set of n-type dopants 524, typically phosphorus and arsenic, and possibly antimony, is ion implanted into the NMOS gate area 606 at a total dose between $1 \cdot 10^{14}$ cm$^{-2}$ and $1 \cdot 10^{16}$ cm$^{-2}$ to form an NMOS gate implanted region 626 in the polysilicon layer 620. The NMOS gate implant photoresist pattern 622 is removed, commonly by exposing the IC 600 to an oxygen containing plasma, followed by a wet cleanup to remove any organic residue from the top surface of the polysilicon layer 620.

Figure 6B:
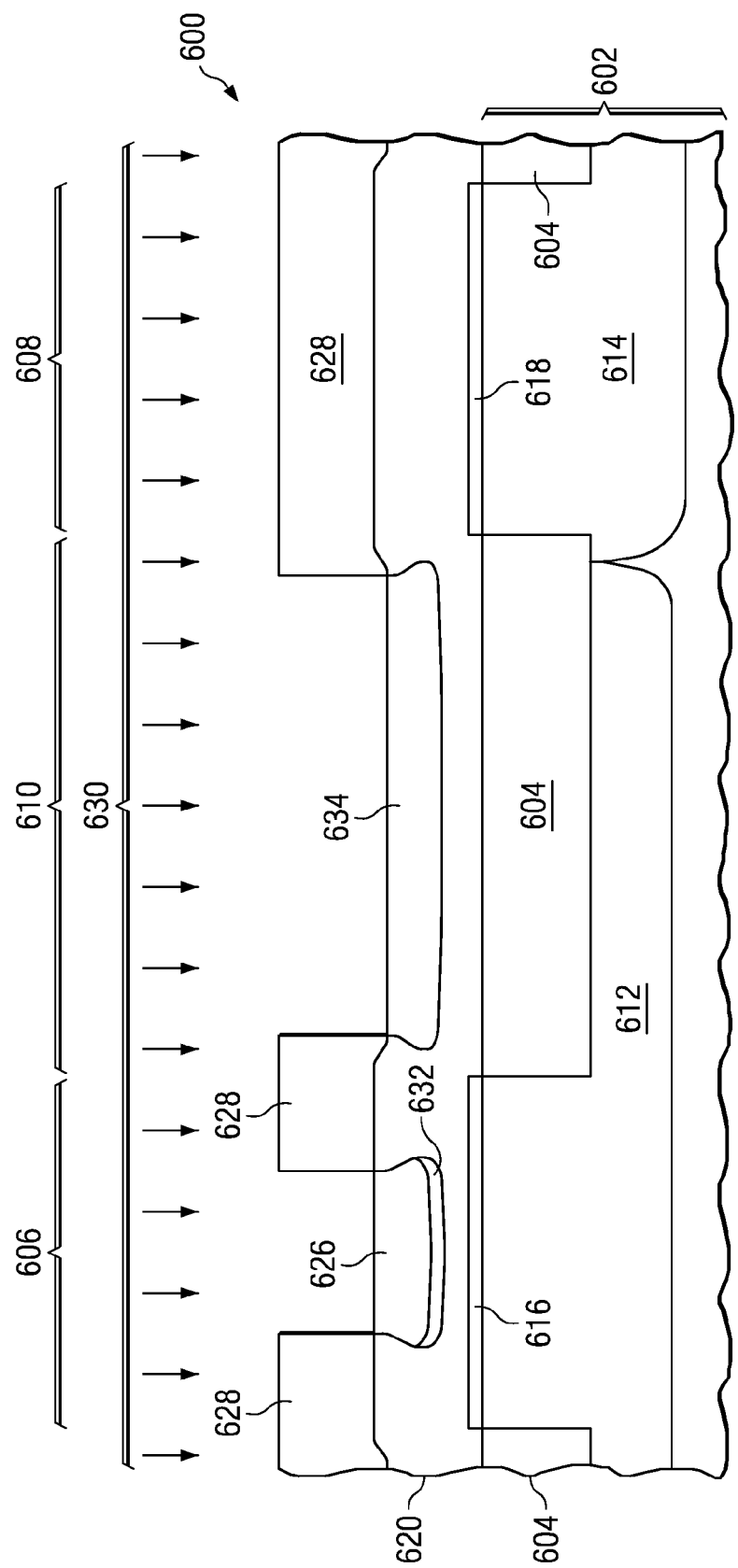

Referring to FIG. 6B, a polysilicon resistor implant photoresist pattern 628 is formed on a top surface of the polysilicon layer 620 which exposes the polysilicon layer 620 in the NMOS gate area in the NMOS area 606 and the resistor area 610. A polysilicon resistor set of p-type dopants 630, typically boron, and possibly gallium and/or indium, is implanted into the narrow PMOS gate area and the resistor area 610 at a total dose between $1 \cdot 10^{14}$ cm$^{-2}$ and $1 \cdot 10^{16}$ cm$^{-2}$ to form a counterdope region 632 in the NMOS gate area of the NMOS area 606, and to form a polysilicon resistor implanted region 634 in the polysilicon layer 620 in the resistor area 610. The polysilicon resistor implant photoresist pattern 628 is removed, commonly by exposing the IC 600 to an oxygen containing plasma, followed by a wet cleanup to remove any organic residue from the top surface of the polysilicon layer 620.

Figure 6C:
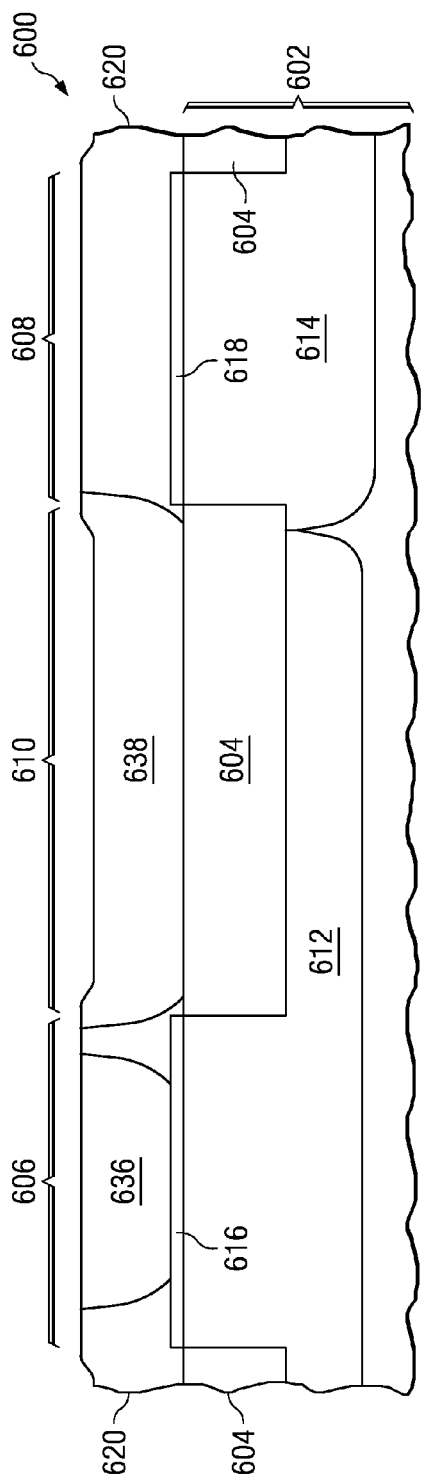

Referring to FIG. 6C, the IC 600 is annealed to diffuse the NMOS gate n-type dopants and the polysilicon resistor p-type dopants throughout the thickness of the polysilicon layer 620 and activate a portion of the dopants, to form a counterdoped NMOS gate diffused region 636 and a p-type resistor diffused region 638. Those familiar with integrated circuit fabrication will recognize that the NMOS gate n-type dopants and the polysilicon resistor set of p-type dopants may be implanted in any order and still obtain the structure described in reference to FIG. 6C.

Figure 6D:
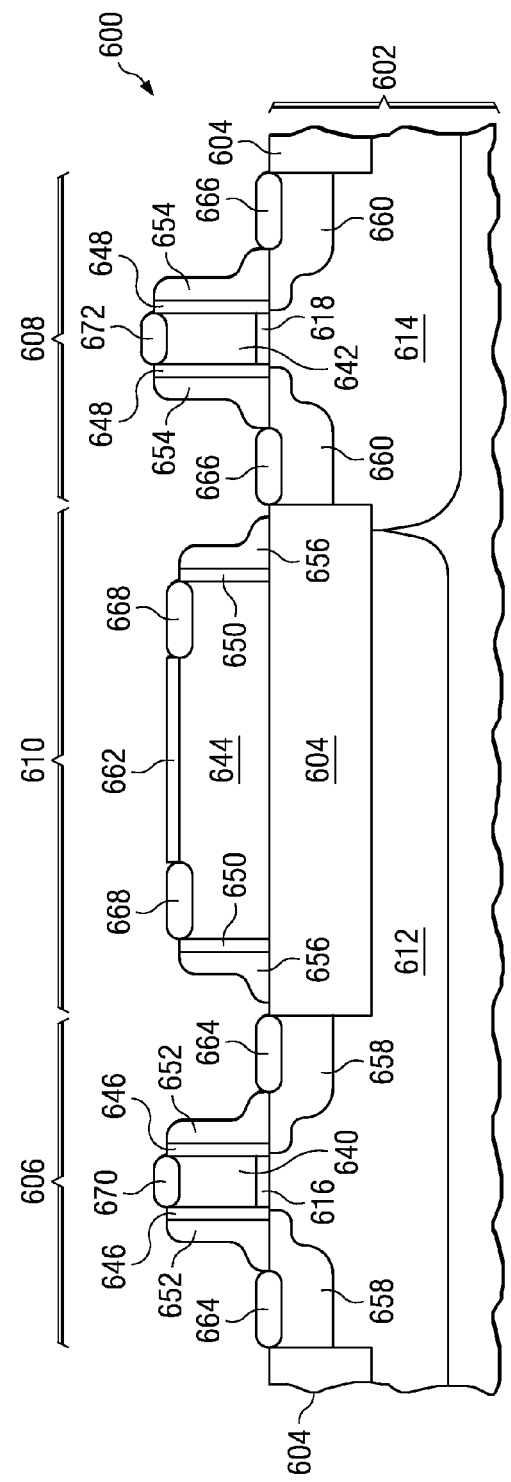

Referring to FIG. 6D, fabrication of the IC 600 continues with formation of an NMOS gate 640, a PMOS gate 642 and a polysilicon resistor body 644, typically by forming a polysilicon etch photoresist pattern on a top surface of the polysilicon layer using known photolithographic methods to expose areas of unwanted polysilicon, and removing unwanted polysilicon using known etching methods. NMOS offset spacers 646 are formed on lateral surfaces of the NMOS gate 640, PMOS offset spacers 648 are formed on lateral surfaces of the PMOS gate 642, and polysilicon resistor offset spacers 650 are formed on lateral surfaces of the polysilicon resistor body 644, as described in reference to FIG. 1D. NMOS sidewall spacers 652 are formed on lateral surfaces of the NMOS offset spacers 646, PMOS sidewall spacers 654 are formed on lateral surfaces of the PMOS offset spacers 648, and polysilicon resistor sidewall spacers 656 are formed on lateral surfaces of the polysilicon resistor offset spacers 650, as described in reference to FIG. 1D. NSD regions 658 are formed in a top region of the p-well 612 adjacent to the NMOS sidewall spacers 652, as described in reference to FIG. 1D. It is common for the NMOS gate 640 to be implanted with NSD dopants during formation of the NSD regions 658. PSD regions 660 are formed in a top region of the n-well 614 adjacent to the PMOS gate sidewall spacers 654, as described in reference to FIG. 1D. It is common for the PMOS gate 642 to be implanted with PSD dopants during formation of the PSD regions 660. A polysilicon resistor silicide block layer 662 is formed by deposition of silicide block material, typically one or more layers of silicon nitride, or one or more layers of silicon dioxide or a stack of silicon nitride and silicon dioxide layers, on the polysilicon resistor body 644, formation of a silicide block photoresist pattern, not shown in FIG. 6D for clarity, on a top surface of the silicide block material using known photolithographic methods, followed by removal of unwanted silicide block material by known etching methods. It is common to perform the deposition and etching processes for forming the NMOS sidewall spacers 652, the PMOS sidewall spacers 654, the polysilicon resistor sidewall spacers 656 and the polysilicon resistor silicide block layer 662 concurrently. NMOS metal silicide layers 664 are formed on top surfaces of the NSD regions 658, PMOS metal silicide layers 666 are formed on top surfaces of the PSD regions 660, resistor contact metal silicide layers 668 are formed on each end of the polysilicon resistor body 640, an optional NMOS gate metal silicide layer 670 is formed on a top surface of the NMOS gate 640 and an optional PMOS gate metal silicide layer 672 is formed on a top surface of the PMOS gate 644, as described in reference to FIG. 1D. Metal silicide is not formed in regions where a silicide block layer, such as the polysilicon resistor silicide block layer 662, is formed on exposed silicon.

During operation of the NMOS transistor, a desired threshold voltage is provided by the presence of the polysilicon resistor set of p-type dopants from the polysilicon resistor ion implantation process, which counterdopes the NMOS gate set of n-type dopants and establishes a desired work function in the NMOS gate 640.

Alternatively, a PMOS gate area may receive p-type dopants during a PMOS gate implant and n-type counterdopants during an ion implantation process to form an n-type resistor body in an n-type polysilicon resistor, providing a desired threshold voltage in a PMOS transistor by establishing a desired work function in a counterdoped PMOS gate of the PMOS transistor.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. A process of forming an integrated circuit, comprising the steps of:
    forming a layer of polysilicon over a substrate;
    ion implanting a blanket set of first dopants into the polysilicon layer concurrently in a MOS transistor gate area and in a polysilicon resistor area;
    ion implanting a set of second dopants into the polysilicon layer concurrently in the MOS transistor gate area and in the polysilicon resistor area;
    forming the MOS transistor in the substrate; and
    forming the polysilicon resistor in the polysilicon layer.

2. The process of claim 1, wherein the process further comprises ion implanting a second set of second dopants into the MOS transistor gate area in a manner that the second set of second dopants are blocked from the polysilicon resistor area.

3. The process of claim 1, wherein the second dopants are p-type dopants, and wherein the MOS transistor is a PMOS transistor, and wherein the polysilicon resistor is a p-type resistor.

4. The process of claim 3, wherein the first dopants are n-type dopants.

5. The process of claim 3, wherein the PMOS transistor is a high voltage PMOS transistor, and wherein the process further comprises ion implanting a second set of p-type dopants into a gate area for a low voltage PMOS transistor in the polysilicon layer in a manner that the second set of dopants are blocked from the high voltage PMOS transistor gate area and from the polysilicon resistor area.

6. The process of claim 3, wherein the PMOS transistor is a narrow PMOS transistor, and wherein the process further comprises ion implanting a second set of p-type dopants concurrently into a gate area for a wide PMOS transistor in the polysilicon layer and the narrow PMOS transistor gate area in a manner that the second set of dopants are blocked from the polysilicon resistor area.

7. A process of forming an integrated circuit, comprising the steps of:
    forming a layer of polysilicon over a substrate;
    ion implanting p-type dopants into the polysilicon layer concurrently in a high voltage PMOS transistor gate area and in the polysilicon resistor area;
    forming the high voltage PMOS transistor in the substrate; and
    forming the polysilicon resistor in the polysilicon layer; and
    ion implanting a second set of p-type dopants into a gate area for a low voltage PMOS transistor in the polysilicon layer in a manner that the second set of dopants are blocked from the high voltage PMOS transistor gate area and from the polysilicon resistor area.

8. A process of forming an integrated circuit, comprising the steps of:
    forming a layer of polysilicon over a substrate;
    ion implanting p-type dopants into the polysilicon layer concurrently in a wide PMOS transistor gate area and in the polysilicon resistor area;
    forming the wide PMOS transistor in the substrate; and
    forming the polysilicon resistor in the polysilicon layer; and
    ion implanting a second set of p-type dopants into a gate area for a narrow PMOS transistor in the polysilicon layer in a manner that the second set of dopants are blocked from the wide PMOS transistor gate area and from the polysilicon resistor area.

9. A method comprising:
    forming a first well of a first conduction type in a substrate;
    forming a second well of a second conduction type in the substrate;
    forming a field oxide layer in the substrate between the first and second wells;
    forming first and second gate dielectric layers over the at least a portion of the first and second wells, respectively;
    forming a polysilicon layer over the field oxide layer, the first gate dielectric layer, and the second dielectric layer;
    ion implanting a blanket set of dopants of the first conduction type into the polysilicon layer over the field oxide layer, the first gate dielectric layer, and the second dielectric layer;
    ion implanting dopants of a second conduction type into the polysilicon layer over the field oxide layer and the first gate dielectric layer;
    forming a first set of source drain regions in the substrate that are substantially adjacent to the first gate dielectric layer;
    forming a second set of source drain regions in the substrate that are substantially adjacent to the second gate dielectric layer; and
    forming first and second silicide layers on the polysilicon layer over the field oxide layer to form a polysilicon resistor of the second conduction type.

10. The method of claim 9, wherein the method further comprises:
    separating the polysilicon layer over the field oxide layer, the first gate dielectric layer, and the second dielectric layer from one another to form first, second, and third polysilicon regions; and
    forming a sidewall spacer on each side of each of the first, second, and third polysilicon regions.

11. The method of claim 10, wherein the method further comprises forming a silicide block layer between the first and second silicide layers.

12. The method of claim 11, wherein the first conduction type is n-type and the second conduction type is p-type.

* * * * *